(12) United States Patent
Tsuboi et al.

(10) Patent No.: US 7,893,596 B2
(45) Date of Patent: Feb. 22, 2011

(54) MICRO MOVABLE ELEMENT AND MICRO MOVABLE ELEMENT ARRAY

(75) Inventors: Osamu Tsuboi, Kawasaki (JP); Norinao Kouma, Kawasaki (JP); Yoshihiro Mizuno, Kawasaki (JP); Hisao Okuda, Kawasaki (JP); Hiromitsu Soneda, Kawasaki (JP); Tsuyoshi Matsumoto, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 12/761,123

(22) Filed: Apr. 15, 2010

(65) Prior Publication Data

US 2010/0194235 A1    Aug. 5, 2010

Related U.S. Application Data

(63) Continuation of application No. PCT/JP2007/071197, filed on Oct. 31, 2007.

(51) Int. Cl.
*H02N 2/00* (2006.01)
(52) U.S. Cl. ...................................... 310/309
(58) Field of Classification Search ................ 310/309; 318/116
See application file for complete search history.

(56) References Cited

U.S. PATENT DOCUMENTS

| | | | |
|---|---|---|---|
| 7,031,040 B2 * | 4/2006 | Fujii et al. | 359/199.1 |
| 7,161,273 B2 * | 1/2007 | Akiba et al. | 310/309 |
| 7,453,182 B2 | 11/2008 | Kouma et al. | |
| 2006/0119216 A1 | 6/2006 | Kouma et al. | |

FOREIGN PATENT DOCUMENTS

| | | |
|---|---|---|
| JP | 2003-019700 A | 1/2003 |
| JP | 2004-341364 A | 12/2004 |
| JP | 2006-072252 A | 3/2006 |
| JP | 2006-162663 A | 6/2006 |
| JP | 2006-162699 A | 6/2006 |

* cited by examiner

*Primary Examiner*—Burton Mullins
(74) *Attorney, Agent, or Firm*—Arent Fox LLP

(57) ABSTRACT

A micro movable device suitable for suppressing deterioration of driving characteristics, and a micro movable device array including such a micro movable device are provided. The micro movable device (X1) of the present invention includes a movable portion including a first driving electrode, a second driving electrode for generating electrostatic attraction between the first driving electrode and the second driving electrode, a first conductor portion (22c) electrically connected to the first driving electrode, a second conductor portion (22b) electrically connected to the second driving electrode, and a third conductor portion (21a) which is not electrically connected to the first and the second driving electrodes and which is bonded to the first conductor portion (22c) via an insulating film (23) and bonded to the second conductor portion (22b) via the insulating film (23).

11 Claims, 21 Drawing Sheets

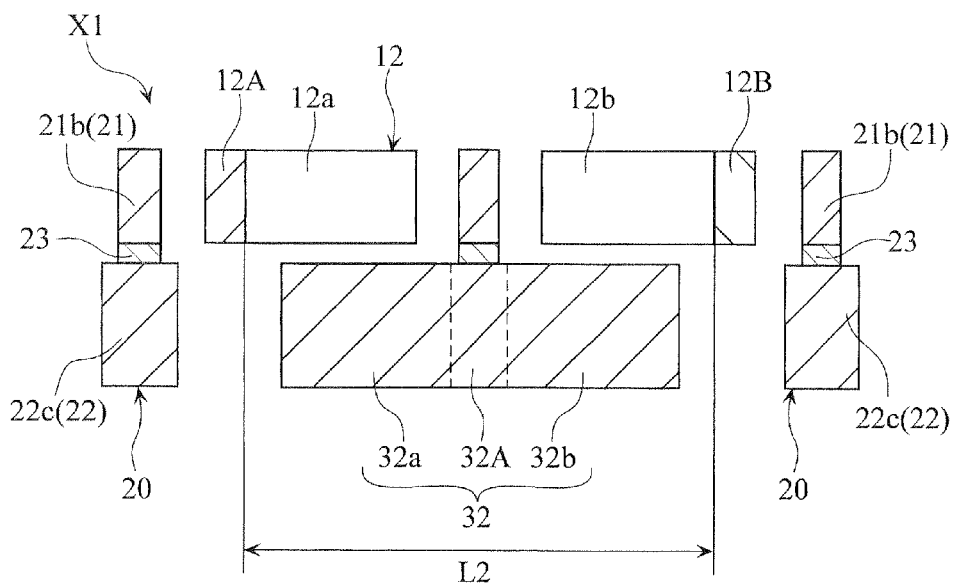
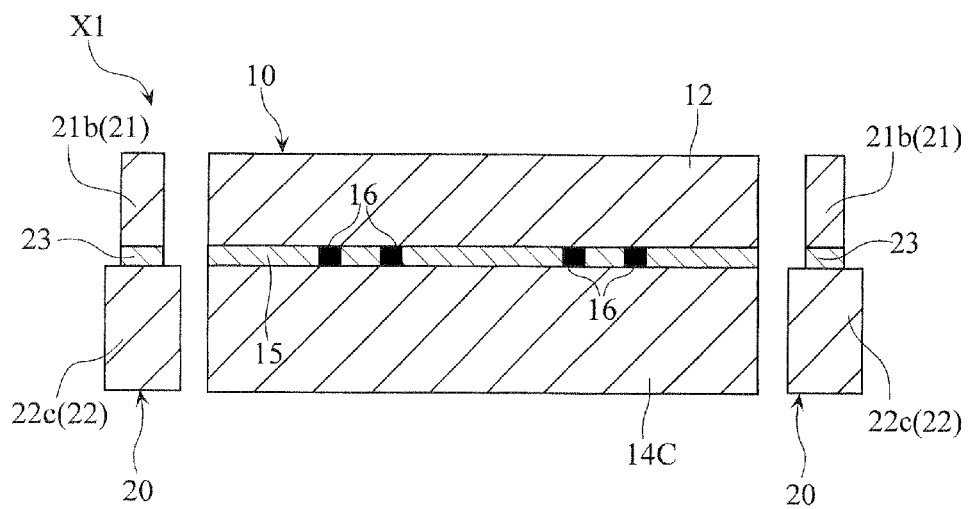

MICRO MOVABLE ELEMENT AND MICRO MOVABLE ELEMENT ARRAY

TECHNICAL FIELD

The present invention relates to a micro movable device including a minute movable portion, such as a micro mirror device, an acceleration sensor, an angular velocity sensor and a vibration device, and also relates to a micro movable device array.

BACKGROUND ART

In recent years, application of devices having micro structures formed by micromachining technology is being promoted in various technical fields. Examples of such devices include micro movable devices including minute movable portions, such as micro mirror devices, angular velocity sensors, acceleration sensors, etc. Micro mirror devices are utilized as a device having a light reflection function in the fields of optical disc technology and optical communication technology, for example. Angular velocity sensors and acceleration sensors are utilized for e.g. camera shake control technology for video cameras or mobile phones equipped with cameras, car navigation systems, airbag release timing control systems and attitude control systems in automobiles and robots. Such micro movable devices are disclosed in e.g. Patent Documents 1-3 identified below:

Patent Document 1: Japanese Laid-open Patent Publication No. 2003-19700

Patent Document 2: Japanese Laid-open Patent Publication No. 2004-341364

Patent Document 3: Japanese Laid-open Patent Publication No. 2006-72252

FIGS. 23-25 illustrate a micro movable device X3 as an example of conventional micro movable device. FIG. 23 is a plan view of the micro movable device X3. FIGS. 24 and 25 are sectional views taken along lines XXIV-XXIV and lines XXV-XXV in FIG. 23, respectively.

The micro movable device X3 includes a pivotable portion 40, a frame 51, a pair of torsion bars 52 and a comb-tooth electrode 53 and is designed as a micro mirror device. To clarify the figure, the pivotable portion 40 and the frame 51 are indicated by hatching in FIG. 23.

The pivotable portion 40 includes a land portion 41, a comb-tooth electrode 42 and a bar portion 43 and is provided to be able to pivot. The obverse surface of the land portion 41 is provided with a mirror surface 41a having a light reflection function. The comb-tooth electrode 42 forms the movable electrode of the driving mechanism of this device and is made of a silicon material which is made electrically conductive. The bar portion 43 is made of a silicon material which is made electrically conductive and connects the land portion 41 and the comb-tooth electrode 42 to each other.

The frame 51 has a shape to surround the pivotable portion 40 and is made of a silicon material which is made electrically conductive.

The paired torsion bars 52 define the axis A3 of the pivot movement of the pivotable portion 40 and the land portion 41. Each of the torsion bars 52 is connected to the bar portion 43 of the pivotable portion 40 and the frame 51 to join these parts to each other. The torsion bars 52 are made of a silicon material which is made electrically conductive and function to electrically connect the frame 51 and the bar portion 43 to each other.

The comb-tooth electrode 53 is a portion to act in cooperation with the comb-tooth electrode 42 to generate electrostatic attraction. As illustrated in FIG. 25, the comb-tooth electrode 53 is fixed to the frame 51 via an insulating film 54. That is, the comb-tooth electrode 53 forms the stationary electrode of the driving mechanism of this device. The comb-tooth electrode 53 is made of a silicon material which is made electrically conductive. The insulating film 54 is made of silicon oxide and has a thickness of 0.5 µm. As illustrated in FIGS. 24 and 25, the comb-tooth electrodes 42 and 53 are positioned at different heights when the pivotable portion 40 is not in operation, for example. The spacing distance between the comb-tooth electrodes 42 and 53 in the non-operating state is about 3 µm. The comb-tooth electrodes 42 and 53 are arranged to be offset from each other so as not come into contact with each other during the pivot movement of the pivotable portion 40.

In the micro mirror device X3, the pivotable portion 40 or the land portion 41 is rotationally displaced about the axis A3 by applying a predetermined potential to each of the comb-tooth electrodes 42 and 53 as required. The application of the potential to the comb-tooth electrode 42 can be achieved via the frame 51, the paired torsion bars 52 and the bar portion 43, and the comb-tooth electrode 42 is connected to ground. When a predetermined potential is applied to each of the comb-tooth electrodes 42 and 53 to generate an electric field and hence a desired electrostatic attraction between the comb-tooth electrodes 42 and 53, the comb-tooth electrode 42 is attracted to the comb-tooth electrode 53. As a result, the pivotable portion 40 or the land portion 41 pivots about the axis A3. The pivotable portion 40 or the land portion 41 can be rotationally displaced to an angle at which the electrostatic attraction between the two electrodes and the total of the torsional resistance forces of the torsion bars 52 balance with each other. To control the amount of rotational displacement in this pivot movement, the potential application to the comb-tooth electrodes 42 and 53 is controlled. When the electrostatic attraction to act between the comb-tooth electrodes 42 and 53 is eliminated, the torsion bars 52 return to the natural state, and the pivotable portion 40 and the land portion 41 have a posture as illustrated in FIG. 25. By driving the pivotable portion 40 or the land portion 41 into the above-described pivot movement, the direction of the light reflection at the mirror surface 41a on the land portion 41 is changed appropriately.

To drive the micro movable device X3, an electric field needs to be generated by generating a potential difference between the comb-tooth electrodes 42 and 53, as described above. However, when a potential difference is generated between the comb-tooth electrodes 42 and 53, a potential difference is generated also between the frame 51, which is electrically connected to the comb-tooth electrode 42, and the comb-tooth electrode 53. Further, to properly drive the micro movable device X3, a relatively strong electric field needs to be generated between the comb-tooth electrodes 42 and 53 by generating a relatively great potential difference. However, in driving the device, an electric field stronger than this tends to be generated at the insulating film 54 intervening between the frame 51 and the comb-tooth electrode 53. This is because the dielectric constant of the insulating film 54 is higher than that of the gap between the comb-tooth electrodes 42 and 53. A stronger electric field is generated at the insulating film 54 as the thickness of the insulating film 54 becomes smaller as compared with the gap between the comb-tooth electrodes 42 and 53.

The strong electric field generated at the insulating film 54 causes the deterioration of insulation properties of the insulating film 54. Thus, in the micro movable device X3, the insulation properties of the insulating film 54, which intervenes between the frame 51 and the comb-tooth electrode 53 to bond these parts together, easily deteriorates. When the insulation properties of the insulating film 54 deteriorate, the driving characteristics of the micro movable device X3 deteriorate. When the insulation properties of the insulating film 54 deteriorates and dielectric breakdown occurs at the insulating film 54, the micro movable device X3 cannot be driven.

The present invention is proposed under the circumstances described above. It is, therefore, an object of the present invention to provide a micro movable device and a micro movable device array which are suitable for suppressing the deterioration of the driving characteristics.

DISCLOSURE OF THE INVENTION

According to a first aspect of the present invention, a micro movable device is provided. The micro movable device includes a movable portion including a first driving electrode, a second driving electrode for generating electrostatic attraction between the first driving electrode and the second driving electrode, a first conductor portion electrically connected to the first driving electrode, a second conductor portion electrically connected to the second driving electrode, and a third conductor portion that is not electrically connected to the first and the second driving electrodes. The third conductor portion is bonded to the first conductor portion via an insulating film and bonded to the second conductor portion via an insulating film. In this micro movable device, the movable portion can be actuated by applying a predetermined potential to each of the first and the second electrodes and generating an electric field between the electrodes to generate a desired electrostatic attraction.

In this micro movable device, when a potential difference is generated and hence an electric field is generated between the first and the second driving electrodes, a potential difference is generated also between the first conductor portion electrically connected to the first driving electrode and the second conductor portion electrically connected to the second driving electrode. In the micro movable device, however, the first and the second conductor portions, between which a relatively great potential difference is generated, are not bonded together via a single insulating film. That is, in the micro movable device, there exists the third conductor portion bonded to the first conductor portion via the insulating film and bonded to the second conductor portion via the insulating film, and the third conductor portion mechanically connects the first and the second conductor portions to each other. Thus, in the micro movable device, the potential difference between the first and the third conductor portions and that between the second and the third conductor portions are suppressed. As a result, the micro movable device can suppress the electric field generated at the insulating film (first insulating film) between the first and the third conductor portions and the electric field generated at the insulating film (second insulating film) between the second and the third conductor portions. For instance, when a constant reference potential is to be applied to the first conductor portion and a constant driving potential is to be applied to the second conductor portion, an intermediate potential between the reference potential and the driving potential is applied to the third conductor portion. By doing so, the potential difference between the first and the third conductor portions is suppressed to result in the suppression of the electric field generated at the first insulating film, while the potential difference between the second and the third conductor portions is suppressed to result in the suppression of the electric field generated at the second insulating film. For instance, when a constant reference potential is to be applied to the first conductor portion and a variable driving potential is to be applied to the second conductor portion, an intermediate potential between the reference potential and the maximum driving potential is applied to the third conductor portion. By doing so, the potential difference between the first and the third conductor portions is suppressed to result in the suppression of the electric field generated at the first insulating film, while the potential difference between the second and the third conductor portions is suppressed to result in the suppression of the electric field generated at the second insulating film. (The maximum driving potential means a driving potential at which the difference from the reference potential is maximum.) For instance, when a constant reference potential is to be applied to the second conductor portion and a variable driving potential is to be applied to the first conductor portion, an intermediate potential between the reference potential and the maximum driving potential is applied to the third conductor portion. By doing so, the potential difference between the first and the third conductor portions is suppressed to result in the suppression of the electric field generated at the first insulating film, while the potential difference between the second and the third conductor portions is suppressed to result in the suppression of the electric field generated at the second insulating film.

Thus, deterioration of the insulation properties of the insulating film is suppressed in the micro movable device in which the electric field to be generated is suppressed at the insulating film (first insulating film) intervening between the first conductor portion and another conductor portion to electrically separate the two conductor portions and also suppressed at the insulating film (second insulating film) intervening between the second conductor portion and another conductor portion to electrically separate the two conductor portions. Thus, the micro movable device is suitable for suppressing deterioration of the driving characteristics caused by the deterioration of the insulation properties.

In a preferred embodiment, the micro movable device further includes a frame, and a connecting portion connecting the frame and the movable portion to each other and defining an axis of pivot movement of the movable portion. In this way, the micro movable device may be designed as a so-called micro oscillation device. In this case, the micro movable device may further include an additional frame, an additional connecting portion connecting the frame and the additional frame to each other and defining an additional axis of pivot movement of the frame which extends in a direction crossing the above-described axis, and a driving mechanism for generating a driving force of the pivot movement of the frame. The micro movable device may be designed as a so-called dual-axis oscillation device having this structure. Preferably, the additional connecting portion includes a portion electrically connected to the first conductor portion, a portion electrically connected to the second conductor portion and a portion electrically connected to the third conductor portion.

The third conductor portion may include a plurality of electrically separated portions including a first portion bonded to the first conductor portion via an insulating film and a second portion bonded to the second conductor portion via an insulating film. With this arrangement, the deterioration of the insulation properties of the first and the second insulating films is easily suppressed.

Preferably, each of the first and the second driving electrodes is a comb-tooth electrode. Preferably, the spacing distance between the first and the second driving electrodes is greater than the thickness of the insulating film between conductor portions. In general, a stronger electric field is generated at a thinner insulating film intervening between conductor portions having a potential difference, which leads to more trouble. However, the present invention, which enjoys the electric field alleviation effects of the insulating film, can employ this structure.

According to a second aspect of the present invention, a micro movable device array is provided. The micro movable device array includes a plurality of micro movable devices according to the first aspect of the present invention. Preferably, a potential can be applied in common to the first driving electrodes of the pivotable portions of the plurality of micro movable devices, whereas a potential can be applied individually to the second driving electrode of each of the micro movable devices.

BRIEF DESCRIPTION OF THE DRAWINGS

FIG. 4 is an enlarged sectional view taken along lines IV-IV in FIG. 1.

FIG. 5 is an enlarged sectional view taken along lines V-V in FIG. 1.

BEST MODE FOR CARRYING OUT THE INVENTION

Figure 1:
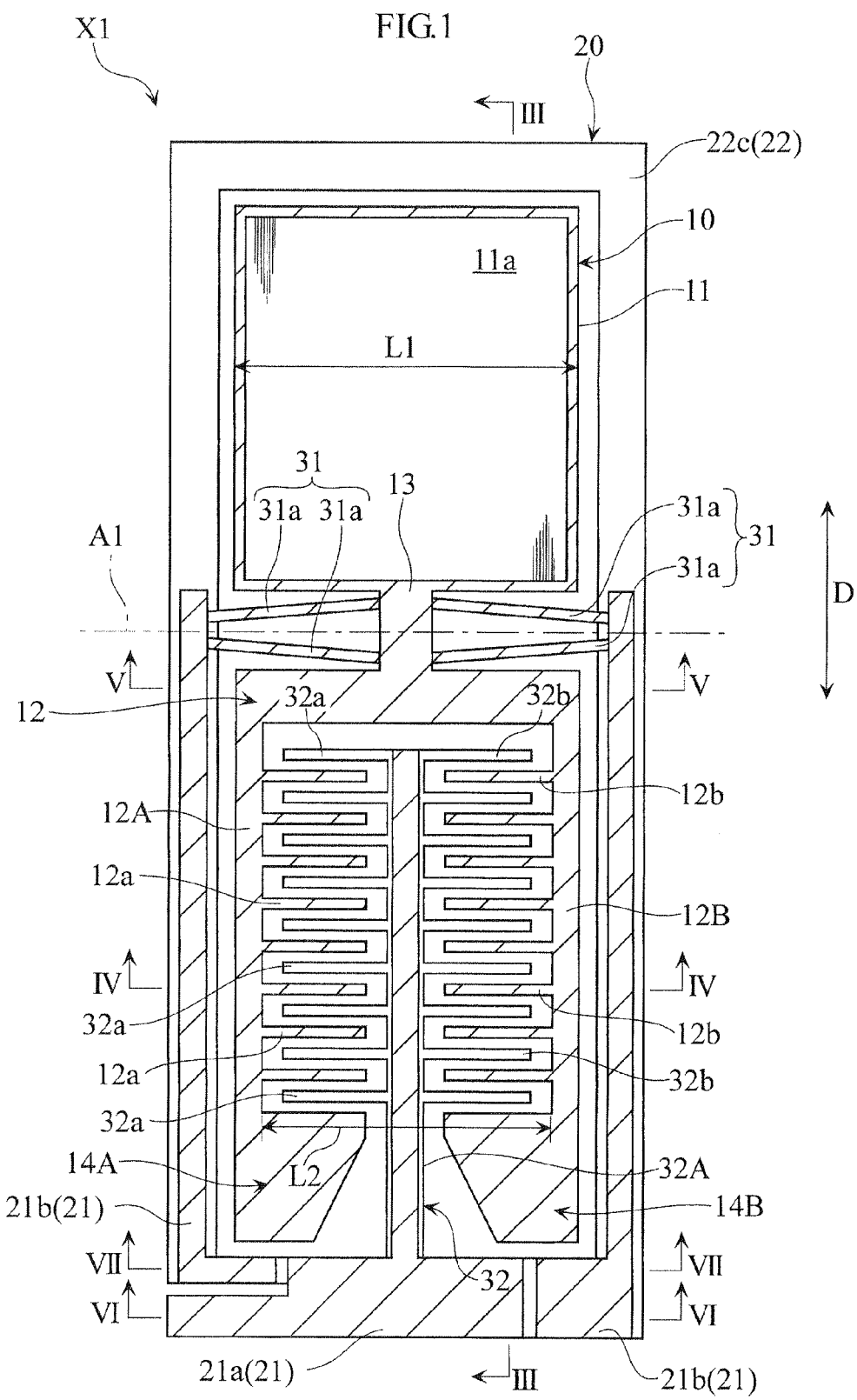
FIG. 1 is a plan view illustrating a micro movable device according to a first embodiment of the present invention.
Figure 2:
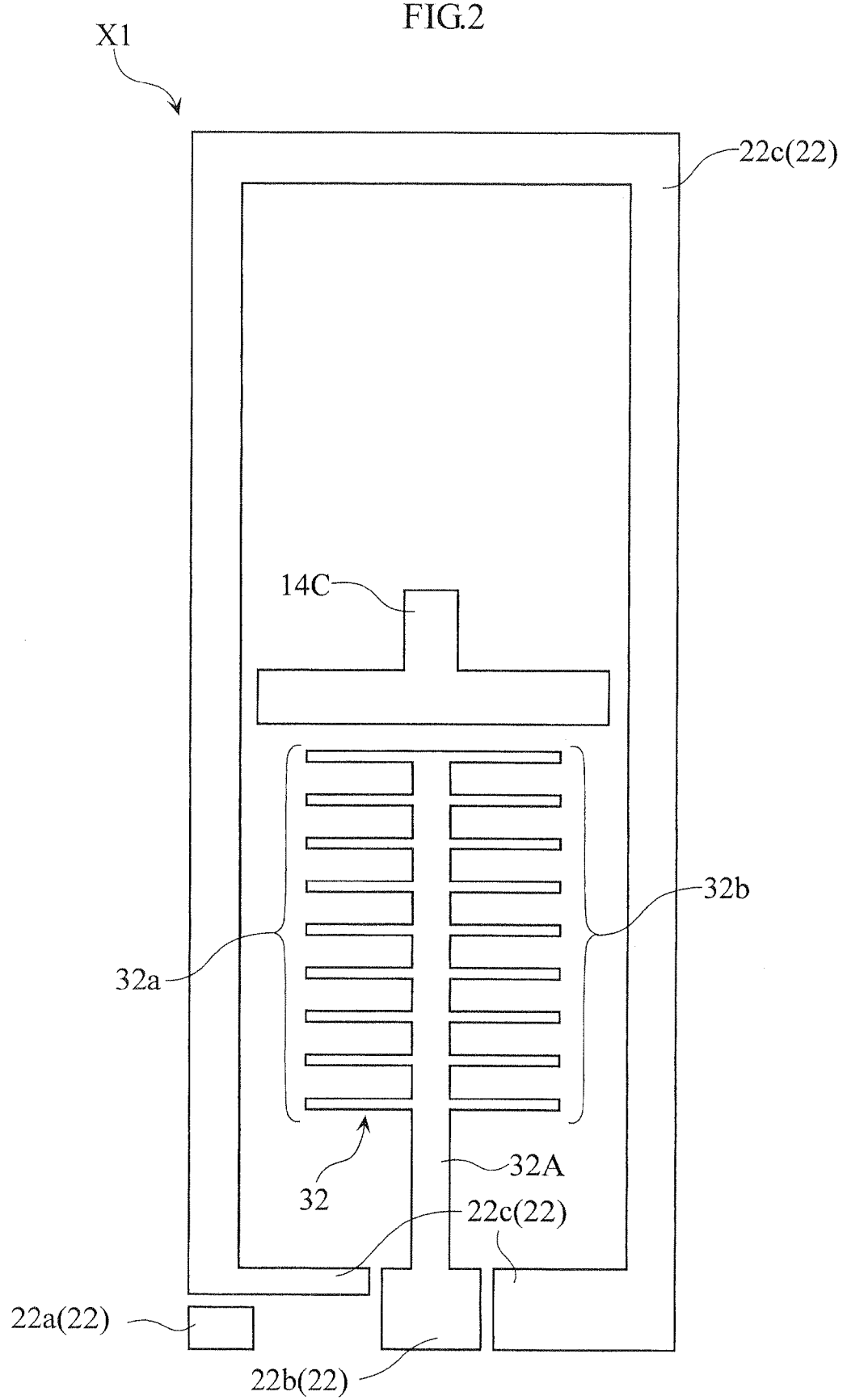
FIG. 2 is a partially omitted plan view of the micro movable device illustrated in FIG. 1.
Figure 3:
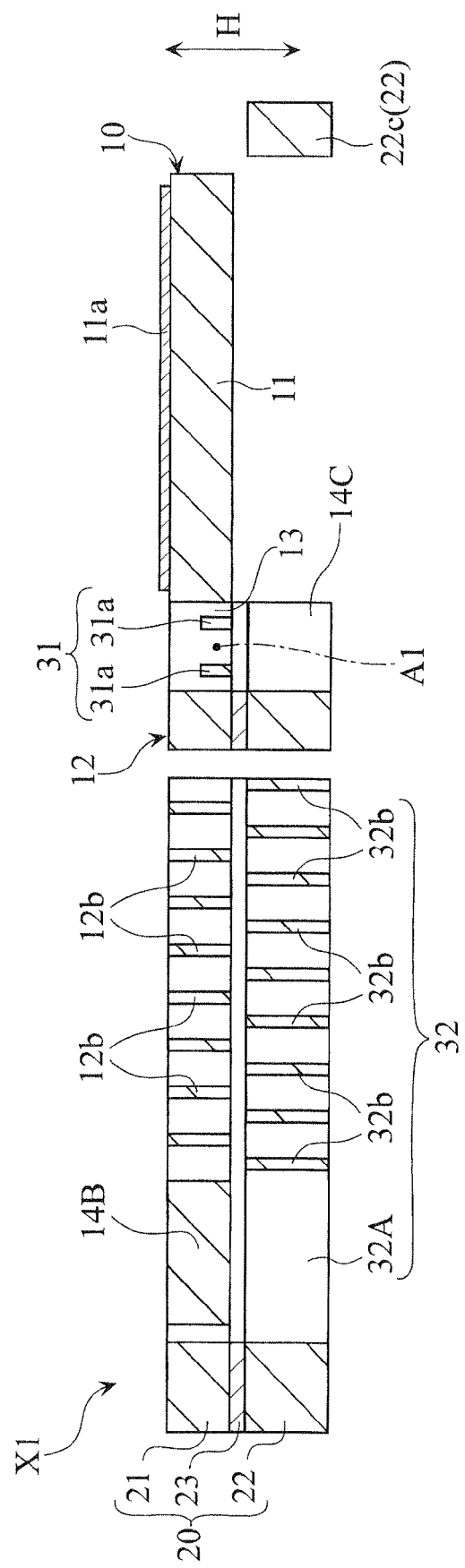
FIG. 3 is a sectional view taken along lines in FIG. 1.

FIGS. 1-7 illustrate a micro movable device X1 according to a first embodiment of the present invention. FIG. 1 is a plan view of the micro movable device X1. FIG. 2 is a partially omitted plan view of the micro movable device X1. FIG. 3 is a sectional view taken along lines in FIG. 1. FIGS. 4-7 are enlarged sectional views taken along lines IV-IV, lines V-V, lines VI-VI and lines VII-VII in FIG. 1, respectively.

The micro movable device X1 includes a pivotable portion 10, a frame 20, a pair of connecting portions 31 and a driving electrode 32 and is designed as a micro mirror device in this embodiment. The micro movable device X1 is made by working a material substrate, which is a so-called SOI (silicon on insulator) wafer, by bulk micromachining such as MEMS. The material substrate has a laminated structure made up of a first silicon layer, a second silicon layer and an insulating film intervening between the silicon layers. Each of the silicon layers has a predetermined electrical conductivity provided by doping impurity. The above-described portions of the micro movable device X1 are mainly made of the first silicon layer and/or the second silicon layer. To clarify the figure, the portions made of the first silicon layer and projecting toward the front side of the sheet surface of the figure relative to the insulating layer are hatched with oblique lines in FIG. 1. The structure illustrated in FIG. 2 is of the portions of the micro movable device X1 which are made of the second silicon layer.

The pivotable portion 10 includes a land portion 11, a driving electrode 12, a bar portion 13 and weight portions 14A, 14B, 14c. The pivotable portion 10 forms a movable portion of the present invention.

The land portion 11 is a portion made of the first silicon layer and has an obverse surface formed with a mirror surface 11a having a light reflecting function. As to the land portion 11, the length L1 indicated in FIG. 1 is e.g. 20 to 300 μm.

The driving electrode 12 is a portion made of the first silicon layer and includes a pair of arms 12A, 12B, a plurality of electrode teeth 12a and a plurality of electrode teeth 12b. The arms 12A and 12B are in parallel with the direction indicated by the arrow D in FIG. 1. The electrode teeth 12a extend from the arm 12A toward the arm 12B side, as illustrated in FIGS. 1 and 4, and are in parallel with each other while being spaced in the extending direction of the arm 12A, as illustrated in FIG. 1. The electrode teeth 12b extend from the arm 12B toward the arm 12A side and are in parallel with each other while being spaced in the extending direction of the arm 12B. The driving electrode 12 is a portion to which a predetermined reference potential (e.g. ground potential) is applied in driving the micro movable device X1. The driving electrode 12 forms the first driving electrode of the present invention.

The bar portion 13 is a portion made of the first silicon layer and connects the land portion 11 and the driving electrode 12 to each other.

The weight portion 14A is fixed to an end of the arm 12A of the driving electrode 12 and electrically connected to the driving electrode 12. The weight portion 14B is fixed to an end of the arm 12B of the driving electrode 12 and electrically connected to the driving electrode 12. As illustrated in FIG. 2, the weight portion 14C is a portion made of the second silicon layer. As illustrated in FIG. 5, at a position between the land portion 11 and the driving electrode 12, the weight portion 14C is bonded to the driving electrode 12 via an insulating film 15. The weight portion 14C and the driving electrode 12 are electrically connected to each other by conductive vias 16 penetrating the insulating film 15.

Figure 6:
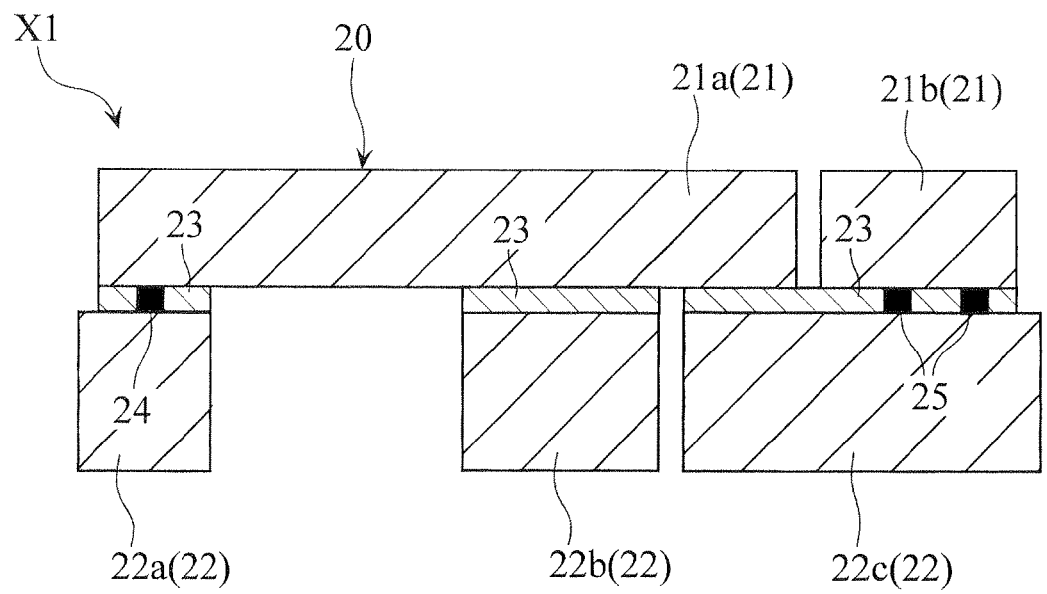
FIG. 6 is an enlarged sectional view taken along lines VI-VI in FIG. 1.

As illustrated in e.g. FIGS. 3 and 6, the frame 20 has a laminated structure made up of a first layer 21 made of the first silicon layer, a second layer 22 made of the second silicon layer, and an insulating film 23 between the first and the second layers 21 and 22.

As illustrated in FIG. 1, the first layer 21 of the frame 20 is made up of portions 21a and 21b separated from each other via gaps and has a shape partially surrounding the pivotable portion 10. The portion 21a is the third conductor portion of the present invention.

As illustrated in e.g. FIG. 2, the second layer 22 of the frame 20 is made up of portions 22a, 22b and 22c separated from each other via gaps, and provides the frame main body having a shape entirely surrounding the pivotable portion 10. The portion 22b is the second conductor portion of the present invention. The portion 22c is the first conductor portion of the present invention.

Figure 7:
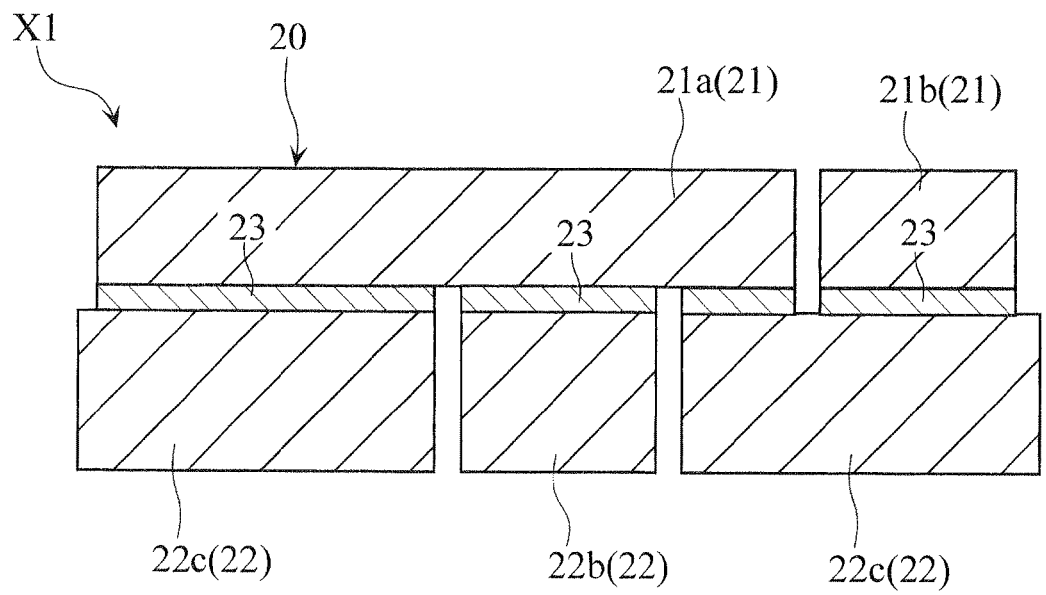
FIG. 7 is an enlarged sectional view taken along lines VII-VII in FIG. 1.

As illustrated in FIG. 6, the portion 21a of the first layer 21 and the portion 22a of the second layer 22 are bonded together via the insulating film 23 and electrically connected to each other via a conductive via 24 penetrating the insulating film 23. As illustrated in FIGS. 6 and 7, the portion 21a of the first layer 21 and the portion 22b of the second layer 22 are bonded together via the insulating film 23. As illustrated in FIGS. 6 and 7, the portion 21a of the first layer 21 and the portion 22c of the second layer 22 are bonded together via the insulating film 23. As illustrated in FIG. 6, the portion 21b of the first layer 21 and the portion 22c of the second layer 22 are bonded together via the insulating film 23 and electrically connected to each other by conductive vias 25 penetrating the insulating film 23.

As illustrated in FIG. 1, each of the connecting portions 31 is made up of two torsion bars 31a. Each of the torsion bars 31a is a portion made of the first silicon layer and connected to the bar portion 13 of the pivotable portion 10 and the portion 21b of the first layer 21 of the frame 20 to join the pivotable portion 10 and the frame 20 to each other. The bar portion 13 and the portion 21b are electrically connected to each other by the torsion bars 31a. The distance between the two torsion bars 31a forming each connecting portion 31 gradually increases from the frame 20 side toward the pivotable portion 10 side. As illustrated in FIG. 3, the torsion bars 31a are thinner than the pivotable portion 10 and also thinner than the first layer 21 of the frame 20 in the thickness direction H. The paired connecting portions 31 define the axis A1 of the pivot movement of the pivotable portion 10 and the land portion 11. The axis A1 is perpendicular to the direction indicated by the arrow D in FIG. 1, i.e., the extending direction of the arms 12A, 12B of the driving electrode 12. Each connecting portion 31 including two torsion bars 31a the distance between which gradually increases from the frame 20 side toward the land 11 side is suitable for preventing the generation of an unnecessary displacement component in the pivot movement of the land portion 11.

As clearly illustrated in FIG. 2, the driving electrode 32 is a portion made of the second silicon layer and made up of an arm 32A, a plurality of electrode teeth 32a and a plurality of electrode teeth 32b. The arm 32A extends from the portion 22b of the second layer 22 of the frame 20 in the direction indicated by the arrow D in FIG. 1. The electrode teeth 32a extend from the arm 32A toward the arm 12A side of the driving electrode 12 and are in parallel with each other while being spaced in the extending direction of the arm 32A. The electrode teeth 32b extend from the arm 32A toward the arm 12B side of the driving electrode 12 and are in parallel with each other while being spaced in the extending direction of the arm 32A.

In the micro movable device X1, the paired driving electrodes 12 and 32 form a driving mechanism or an actuator for generating a driving force for the pivotable portion 10. In the driving mechanism, the arms 12A and 12B of the driving electrode 12 are spaced from each other and extend perpendicularly to the axis A1. In the structure of the driving mechanism made up of the driving electrodes 12 and 32, the paired arms 12A and 12B form the outermost portion in the extending direction of the axis A1 for the pivotable portion 10. As illustrated in FIGS. 1 and 4, the driving electrode 32 is arranged within the spacing distance L2 between the arms 12A and 12B. The spacing distance 12 is e.g. 10 to 300 μm. The spacing distance between the driving electrodes 12 and 32 is greater than the thickness of the insulating film 23 and e.g. 0.5 to 20 μm.

In the pivotable portion 10 of the micro movable device X1, the land portion 11, the driving electrode 12 and the weight portions 14A, 14B are so arranged that the driving electrode 12, which has a less dense structure than the land portion 11, is positioned between the land portion 11 and the weight portions 14A, 14B. The axis A1 of the pivot movement of the pivotable portion 10 is defined by the connecting portions 31 or torsion bars 31a, which are connected to the bar portion 13 between the land portion 10 and the driving electrode 12 to join the frame 20 and the pivotable portion 10. In this arrangement, since the weight portions 14A and 14B are connected to the driving electrode 12 side, which has a relatively less dense structure, a weight balance around the axis A1 is easily achieved in the pivotable portion 10 including the land portion 11 and the driving electrode 12. (Particularly, it is easy to achieve a weight balance between one side of the axis A1 and the other side of the axis A1 in the direction indicated by the arrow D in FIG. 1).

In addition to such weight portions 14A and 14B, the pivotable portion 10 of the micro movable device X1 includes the weight portion 14C. The weight portion 14C is laminated on the driving electrode 12 in the thickness direction H of the pivotable portion 10. The weight portion 14C contributes to the achievement of a weight balance around the axis A1 in the pivotable portion 10 including the land portion 11, the driving electrode 12 and the weight portion 14A, 14B. (Particularly, the weight portion 14C contributes to the achievement of a weight balance between one side of the axis A1 and the other side of the axis A1 in the thickness direction H of the pivotable portion 10.)

In the micro movable device X1, a weight balance around the axis A1 with respect to the pivotable portion 10 is achieved owing to the provision of the weight portions 14A, 14B and 14C. Specifically, in addition to the land portion 11, the driving electrode 12 and the bar portion 13, the pivotable portion 10 includes the weight portions 14A, 14B, 14C arranged to satisfy the following conditions: Of the pivotable portion 10, the mass of the structure positioned on the right side of the axis A1 in FIG. 3 (i.e., the structure including the land portion 11, part of the bar portion 13 and part of the weight portion 14C) equals to the mass of the structure positioned on the left side of the axis A1 in FIG. 3 (i.e., the structure including the driving electrode 12, part of the bar portion 13, weight portions 14A, 14B and part of the weight portion 14C). (That is, of the pivotable portion 10, the mass of the structure positioned on the upper side of the axis A1 in FIG. 1 equals the mass of the structure positioned on the lower side of the axis A1 in FIG. 1.) Further, of the pivotable portion 10, the mass of the structure positioned on the upper side of the axis A1 in FIG. 3 (i.e., the structure including part of the land 11, part of the driving electrode 12, part of the bar portion 13 and part of the weight portions 14A, 14B) equals to the mass of the structure positioned on the lower side of the axis A1 in FIG. 3 (i.e., the structure including part of the land 11, part of the driving electrode 12, part of the bar portion 13, part of the weight portions 14A, 14B and part of the weight portion 14C).

To drive the micro movable device X1, a reference potential is applied to the driving electrode 12 of the pivotable portion 10, a driving potential is applied to the driving electrode 32, and an intermediate potential is applied to the portion 21a of the first layer 21 of the frame 20.

The application of a reference potential to the driving electrode 12 can be achieved via the portion 22c of the second layer 22 of the frame 20 (illustrated in e.g. FIGS. 2 and 6), the conductive vias 25, the portion 21b of the first layer 21, the torsion bars 31a of the connecting portions 31 (illustrated in e.g. FIG. 1) and the bar portion 13 of the pivotable portion 10. The reference potential is e.g. a ground potential or $-V_1$ and maintained constant. By applying a driving potential to the driving electrode 32, an electrostatic attraction is generated between the driving electrodes 12 and 32 (between the electrode teeth 12a and 32a and between the electrode teeth 12b and 32b). The application of the potential to the driving electrode 32 can be achieved via the portion 22b of the second layer 22 of the frame 20 (illustrated in e.g. FIG. 2). When the reference potential is a ground potential, the driving potential is e.g. 0 to $V_2$. When the reference potential is $-V_1$, the driving potential is e.g. $-V_1$ to $V_3$ ($|-V_1|=|V_3|$). In driving the device in this way, an intermediate potential between the reference potential and the maximum driving potential is applied to the portion 21a of the first layer 21 of the frame 20. (The maximum driving potential means a driving potential at which the difference from the reference potential is maximum.) The application of the intermediate potential to the portion 21a can be achieved via the portion 22a of the second layer 22 of the frame 20 (illustrated in FIGS. 2 and 6) and the conductive via 24. When the reference potential is a ground potential and the driving potential is 0 to $V_2$, the intermediate potential is e.g. $V_2/2$. When the reference potential is $-V_1$ and the driving potential is e.g. $-V_1$ to $V_3$ ($|-V_1|=|V_3|$), the intermediate potential is e.g. a ground potential.

Figure 8:
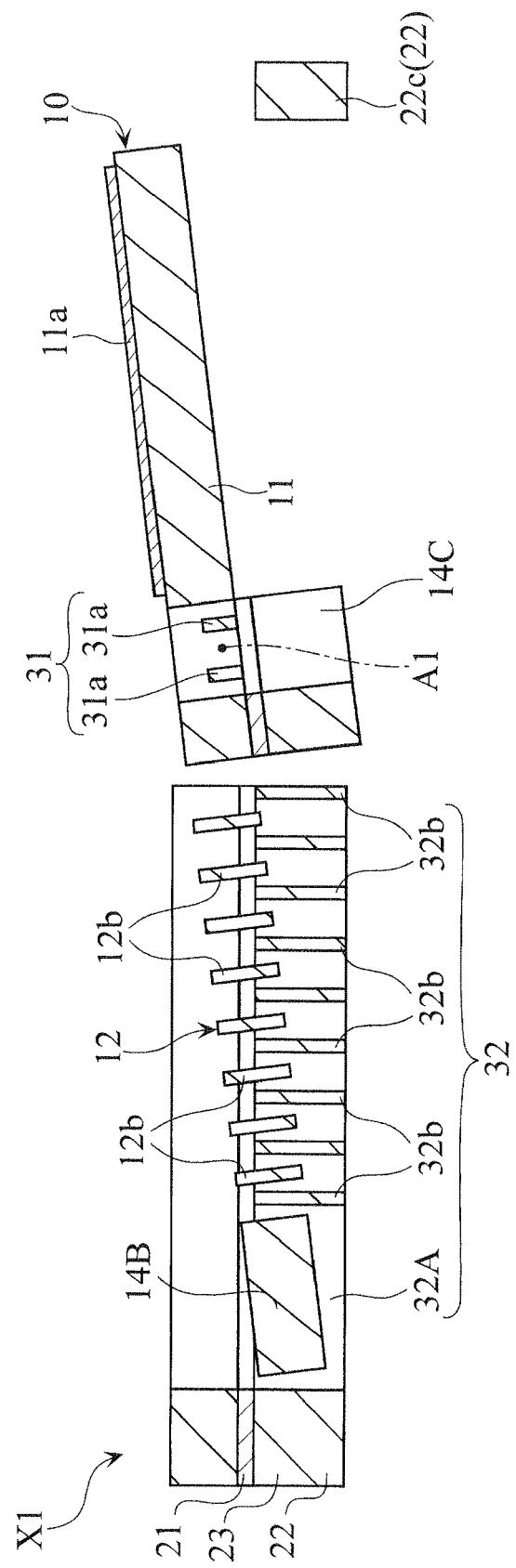
FIG. 8 is a sectional view in the driving state taken along lines in FIG. 1.

When a potential difference higher than a predetermined value is generated and an electrostatic attraction greater than a predetermined value is generated between the driving electrodes 12 and 32, the driving electrode 12 is attracted toward the driving electrode 32. As a result, the pivotable portion 10 or the land 11 pivots about the axis A1 to be rotationally displaced to an angle at which the electrostatic attraction and the total of the torsional resistance forces of the torsion bars 31a balance with each other. In the balanced state, the driving electrodes 12 and 32 have a posture illustrated in e.g. FIG. 8. The amount of the rotational displacement by the pivot movement can be adjusted by controlling the driving potential to be applied to the driving electrode 32. When the electrostatic attraction between the driving electrodes 12 and 32 is eliminated, each of the torsion bars 31a returns to its natural state, so that the pivotable portion 10 or the land portion 11 has a posture as illustrated in FIG. 3. By driving the pivotable portion 10 or the land portion 11 into the pivot movement as described above, the direction of light reflection at the mirror surface 11a provided on the land portion 11 is changed appropriately.

In the micro movable device X1, when a potential difference is generated and hence an electric field is generated between the driving electrodes 12 and 32, a potential difference is generated also between the portion 22c (first conductor portion) of the second layer 22 of the frame 20, which is electrically connected to the driving electrode 12, and the portion 22b (second conductor portion) of the second layer 22 of the frame 20, which is electrically connected to the driving electrode 32. In the micro movable device X1, however, the portions 22b and 22c, between which a relatively great potential difference is generated, are not bonded together via a single insulating film. That is, in the micro movable device X1, there exists the portion 21a (third conductor portion) of the first layer 21 of the frame 20, which is bonded to the portion 22c via the insulating film 23 (first insulating film) and bonded to the portion 22b via the insulating film 23 (second insulating film), and this portion 21a mechanically connects the portions 22b and 22c to each other. Thus, in the micro movable device X1, the potential difference between the portions 21a and 22c and that between the portions 21a and 22b are suppressed. As a result, the micro movable device X1 can suppress the electric field generated at the insulating film 23 between the portions 21a and 22c and the electric field generated at the insulating film 23 between the portions 21a and 22b. Specifically, when a reference potential is to be applied to the portion 22c and a variable driving potential is to be applied to the portion 22b, an intermediate potential between the reference potential and the maximum driving potential is applied to the portion 21a. By doing so, the potential difference between the portions 21a and 22c is suppressed to result in the suppression of the electric field generated at the insulating film 23 (first insulating film), while the potential difference between the portions 21a and 22b is suppressed to result in the suppression of the electric field generated at the insulating film 23 (second insulating film).

Thus, deterioration of the insulation properties of the insulating film 23 is suppressed in the micro movable device X1 in which the electric field to be generated is suppressed at the insulating film 23 (first insulating film) intervening between the portion 22c (first conductor portion) and another conductor portion (portion 21a) to electrically separate the two conductor portions and also suppressed at the insulating film 23 (second insulating film) intervening between the portion 22b (second conductor portion) and another conductor portion (portion 21a) to electrically separate the two conductor portions. Thus, the micro movable device X1 is suitable for suppressing deterioration of the driving characteristics caused by the deterioration of the insulation properties.

To drive the micro movable device X1, a reference potential may be applied to the driving electrode 32, a driving potential may be applied to the driving electrode 12 of the pivotable portion 10, and an intermediate potential may be applied to the portion 21a of the first layer 21 of the frame 20. In this case, the reference potential to be applied to the driving electrode 32 is e.g. a ground potential or $-V_1$ and maintained constant. When the reference potential is a ground potential, the driving potential to be applied to the driving electrode 12 is e.g. 0 to $V_2$, and the intermediate potential to be applied to the portion 21a is e.g. $V_2/2$. When the reference potential is $-V_1$, the driving potential to be applied to the driving electrode 12 is e.g. $-V_1$ to $V_3$ ($|-V_1|=|V_3|$), and the intermediate potential to be applied to the portion 21a is e.g. a ground potential.

In the micro movable device X1, the pivotable portion 10 achieves a weight balance owing to the provision of the weight portions 14A, 14B and 14C, as noted before. Thus, the amount of the rotational displacement of the pivotable portion 10 in the pivot movement is easily controlled with a high accuracy.

In the micro movable device X1, in the structure of the driving mechanism made up of the driving electrodes 12 and 32, the arms 12A and 12B, which are part of the driving electrode 12, form the outermost portion in the extending direction of the axis A1 for the pivotable portion 10. Further, in driving the device, a reference potential (e.g. a ground potential) is applied to the driving electrode 12 including the arms 12A and 12B. The driving electrode 32 is provided within the spacing distance 12 between the arms 12A and 12B. With this arrangement, the electric field which is generated during the driving of the device from the driving electrode 32 due to a predetermined driving potential higher than the reference potential is easily absorbed by the arms 12A, 12B of the driving electrode 12. (That is, the electric field generated from the driving electrode 32 is unlikely to leak over the arms 12A, 12B to the outside of the driving mechanism.) Thus, the micro movable device X1 is suitable for suppressing the leakage of the electric field to the outside of the device during the driving of the device. Such a micro movable device X1 is suitable for forming a micro movable device array with a high device density. In the micro movable device array, a plurality of micro movable devices X1 can be arranged one-dimensionally or two-dimensionally.

In the micro movable device X1, the driving electrode 12, the weight portion 14C of the pivotable portion 10, the portion 21b of the first layer 21 of the frame 20, and the portion 22c of the second layer 22 of the frame 20 are electrically connected to each other. Thus, in driving the device, a reference potential (e.g. a ground potential) is applied also to the weight portion 14C, the portion 21b of the first layer 21 and the portion 22c of the second layer 22 as well as the driving electrode 12. Thus, the electric field generated during the driving of the device from the driving electrode 32 toward e.g. the land 11 side due to a predetermined driving potential higher than the reference potential is easily absorbed by the weight portion 14C. (That is, the weight portion 14C functions also as an electric field shield, and the electric field is unlikely to reach e.g. the land portion 11 over the weight portion 14C.) Further, the electric field generated from the driving electrode 32 during the driving of the device is easily absorbed by the portion 21b of the first layer 21. (That is, the portion 21b functions also as an electric field shield, and the electric field is unlikely to leak to the outside of the device over the portion 21b of the first layer 21 of the frame 20.) Moreover, the electric field generated from the driving electrode 32 during the driving of the device is easily absorbed by the portion 22c of the second layer 22. (That is, the portion 22c functions also as an electric field shield, and the electric field is unlikely to leak to the outside of the device over the portion 22c of the second layer 22 of the frame 20.) These effects of electric field absorption contribute to the suppression of leakage of the electric field to the outside of the device.

In the micro movable device X1, the portion 22b (the second conductor portion) and the portion 22c (the first conductor portion), between which a relatively great potential difference is generated within the frame 20, are mechanically connected to each other by the portion 21a (third conductor portion), which is bonded to the portion 22c via the insulating film 23 and bonded to the portion 22b via the insulating film 23, as noted before. However, instead of this arrangement, the portion 22b (the second conductor portion) and the portion 22c (the first conductor portion) may be mechanically connected to each other by a plurality of portions which are electrically separated from each other while being connected to each other via an insulating film. In this case, the plurality of portions include a first part bonded to the portion 22c via the insulating film 23 and a second part bonded to the portion 22b via the insulating film 23. With this arrangement, deterioration of the insulation properties of the insulating film 23, which is in contact with the above-described portions 22b and 22c, is easily suppressed.

Figure 9:
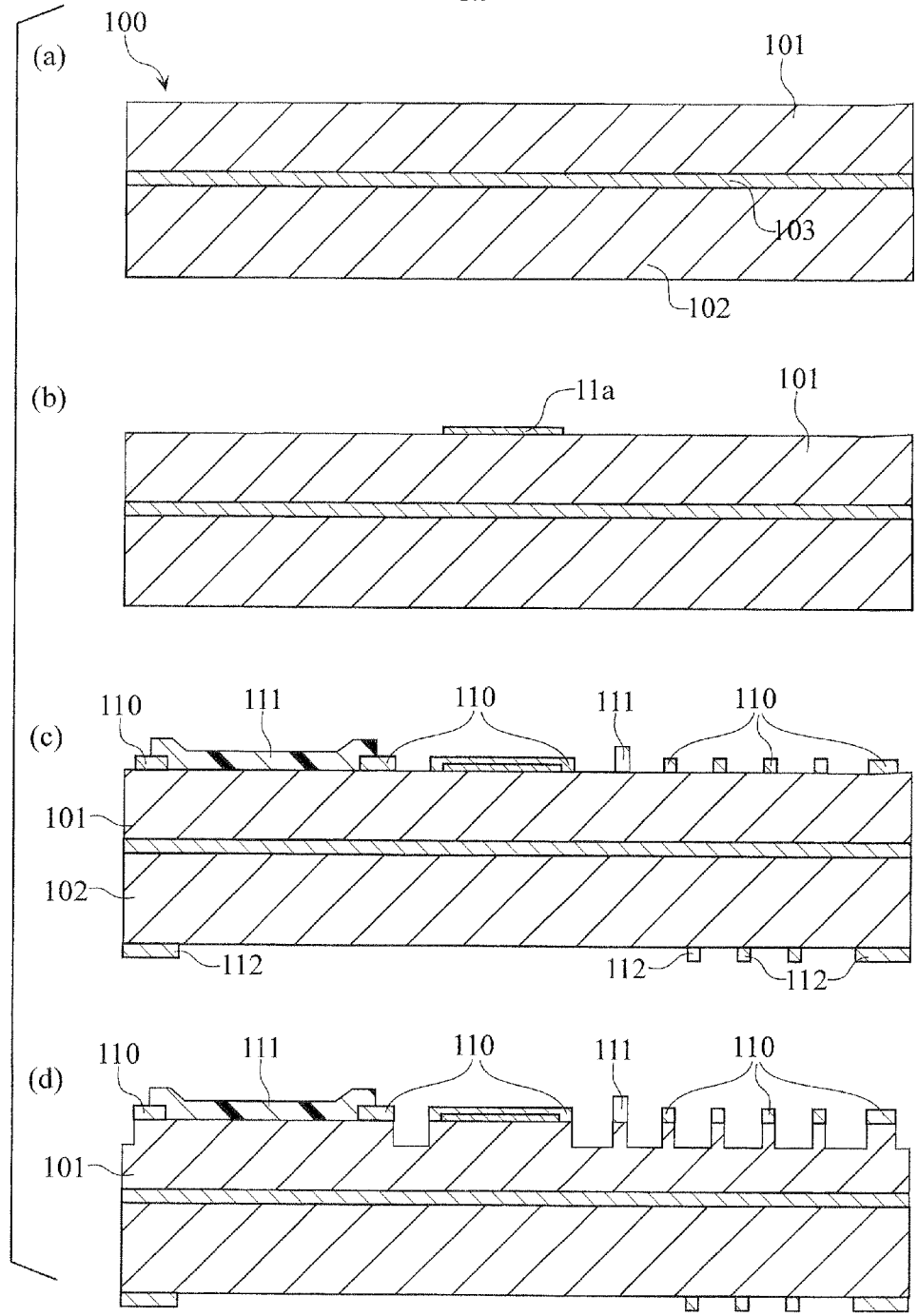
FIG. 9 illustrates some steps of a method for making the micro movable device illustrated in FIG. 1.
Figure 10:
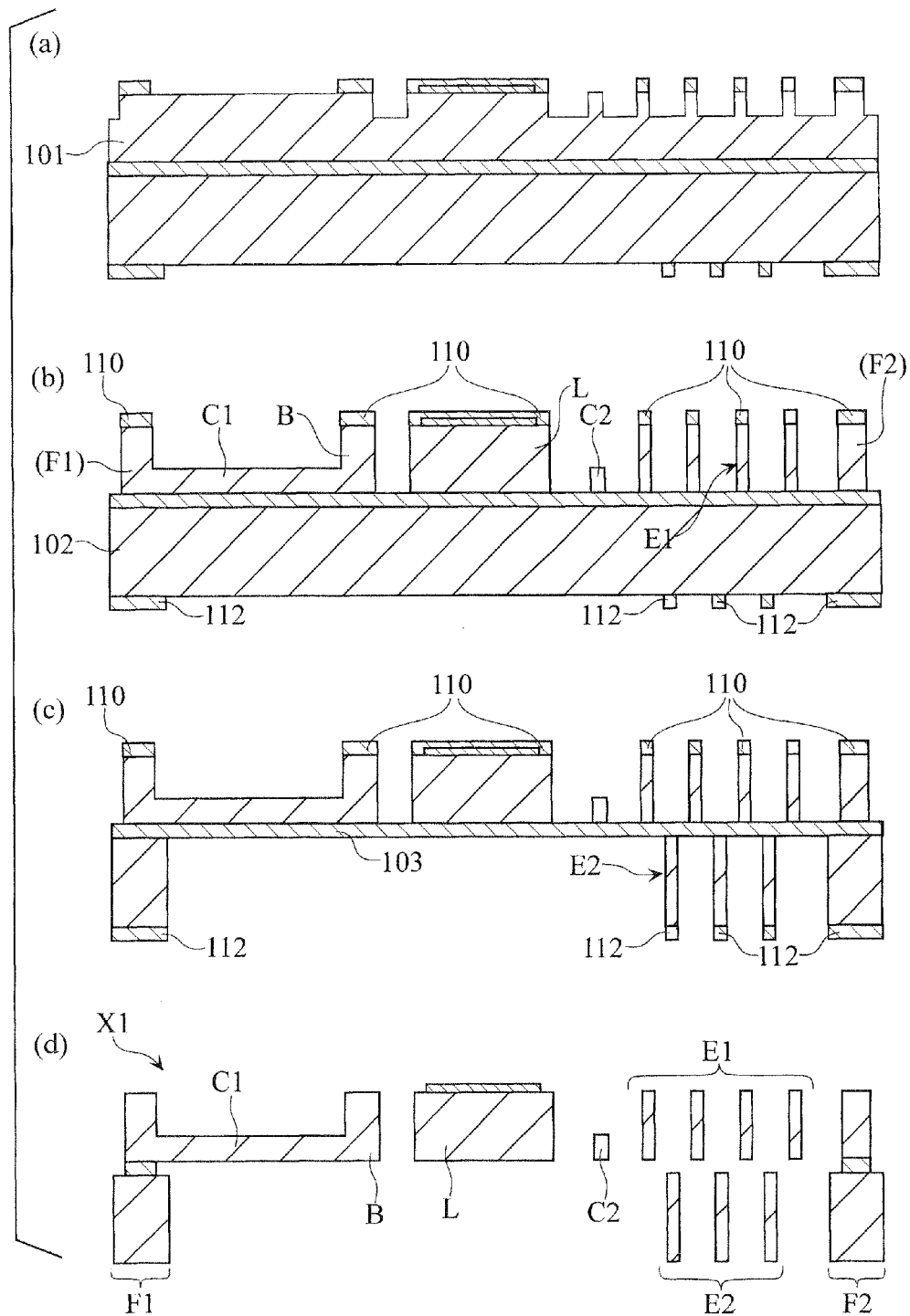
FIG. 10 illustrates steps to be performed subsequent to the steps illustrated in FIG. 9.

FIGS. 9 and 10 illustrate an example of a method for making a micro movable device X1. This method is a method for making the micro movable device X1 using the bulk micromachining technology. In FIGS. 9 and 10, the process for forming a land portion L, a bar portion B, frames F1, F2, connecting portions C1, C2 and a set of electrodes E1, E2 illustrated in FIG. 10(d) is illustrated as changes in one cross section. The one cross section is obtained by modeling multiple cross sections included in one micro movable device forming compartment in a material substrate (a wafer having a multilayer structure) to be processed and by representing them as a continuous cross section. The land portion L corresponds to part of the land portion 11. The bar portion B corresponds to the bar portion 13 and represents the transverse cross section of the bar portion 13. The frames F1 and F2 respectively correspond to the frame 20 and represent the transverse cross section of the frame 20. The connecting portion C1 corresponds to the connecting portion 31 and represents the cross section of the torsion bar 31a in the extending direction thereof. The connecting portion C2 corresponds to the connecting portion 31 and represents the transverse cross section of the torsion bar 31a. The electrode E1 corresponds to part of the driving electrode 12 and represents the transverse cross sections of the electrode teeth 12a and 12b. The electrode E2 corresponds to part of the driving electrodes 32 and represents the transverse cross sections of the electrode teeth 32a and 32b.

To make a micro movable device X1, a material substrate 100 as illustrated in FIG. 9(a) is prepared. The material substrate 100 is an SOI wafer having a laminated structure made up of silicon layers 101 and 102, and an insulating layer 103 arranged between the silicon layers 101 and 102. Though not illustrated in these figures, the material substrate 100 includes conductive vias 16, 24 and 25 embedded therein. The silicon layers 101 and 102 are made of a silicon material to which electrical conductivity is imparted by impurity doping. As the impurity, use may be made of a p-type impurity such as B or an n-type impurity such as P or Sb. The insulating layer 103 is made of e.g. silicon oxide. The silicon layer 101 has a thickness of e.g. 10 to 100 μm, whereas the silicon layer 102 has a thickness of e.g. 50 to 500 μm. The insulating layer 103 has a thickness of e.g. 0.3 to 3 μm.

Then, as illustrated in FIG. 9(b), a mirror surface 11a is formed on the silicon layer 101. Specifically, to form the mirror surface 11a, a film of Cr (50 nm) and then a film of Au (200 nm), for example, are successively formed on the silicon layer 101 by sputtering. Then, by performing etching with respect to these metal films via a predetermined mask, the mirror surface 11a is patterned. As the etchant for Au, an aqueous solution of potassium iodide-iodine may be used. As the etchant for Cr, an aqueous solution of di-ammonium cerium nitrate may be used.

Figure 11:
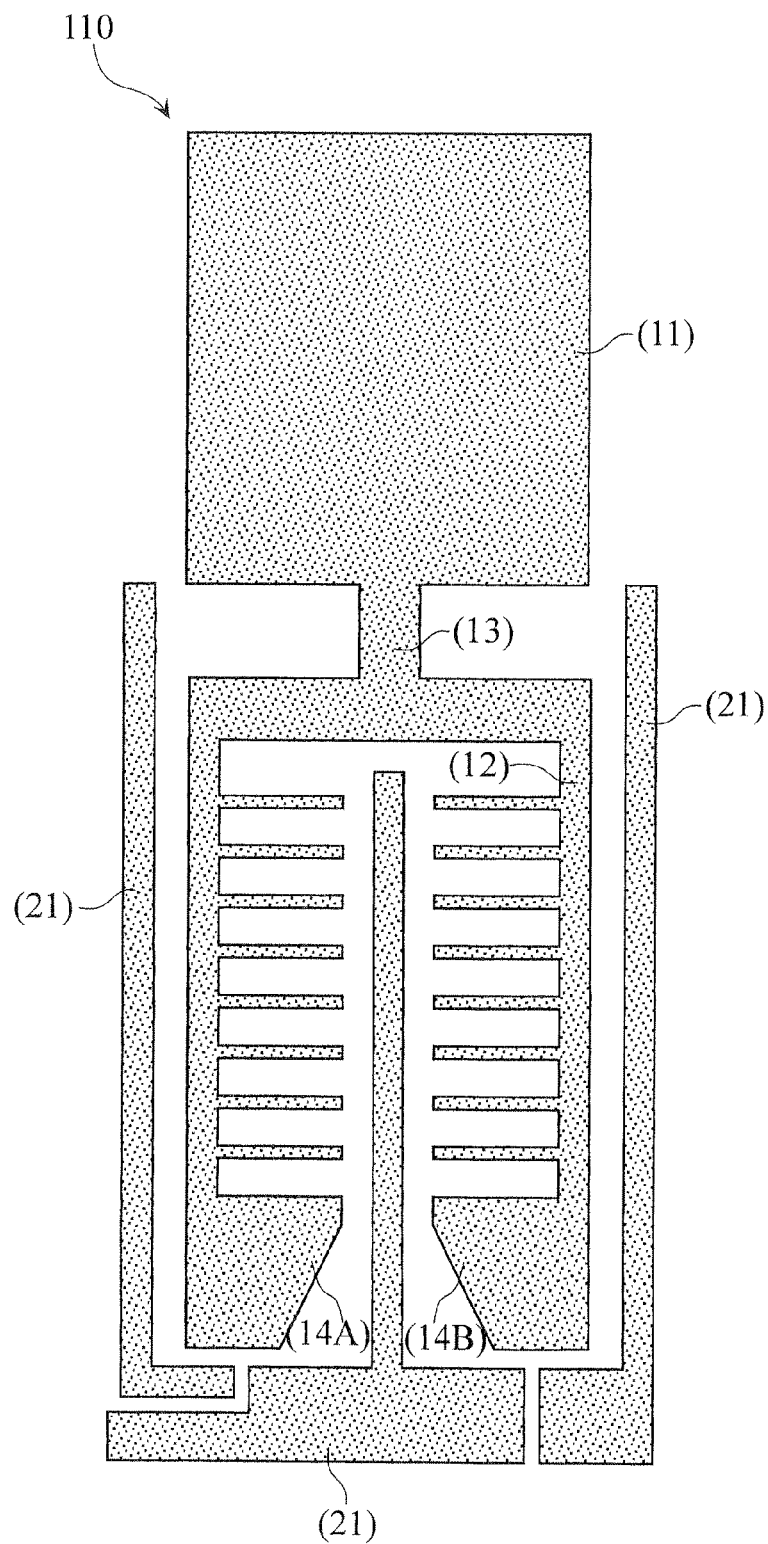
FIG. 11 is a plan view illustrating a mask pattern.
Figure 12:
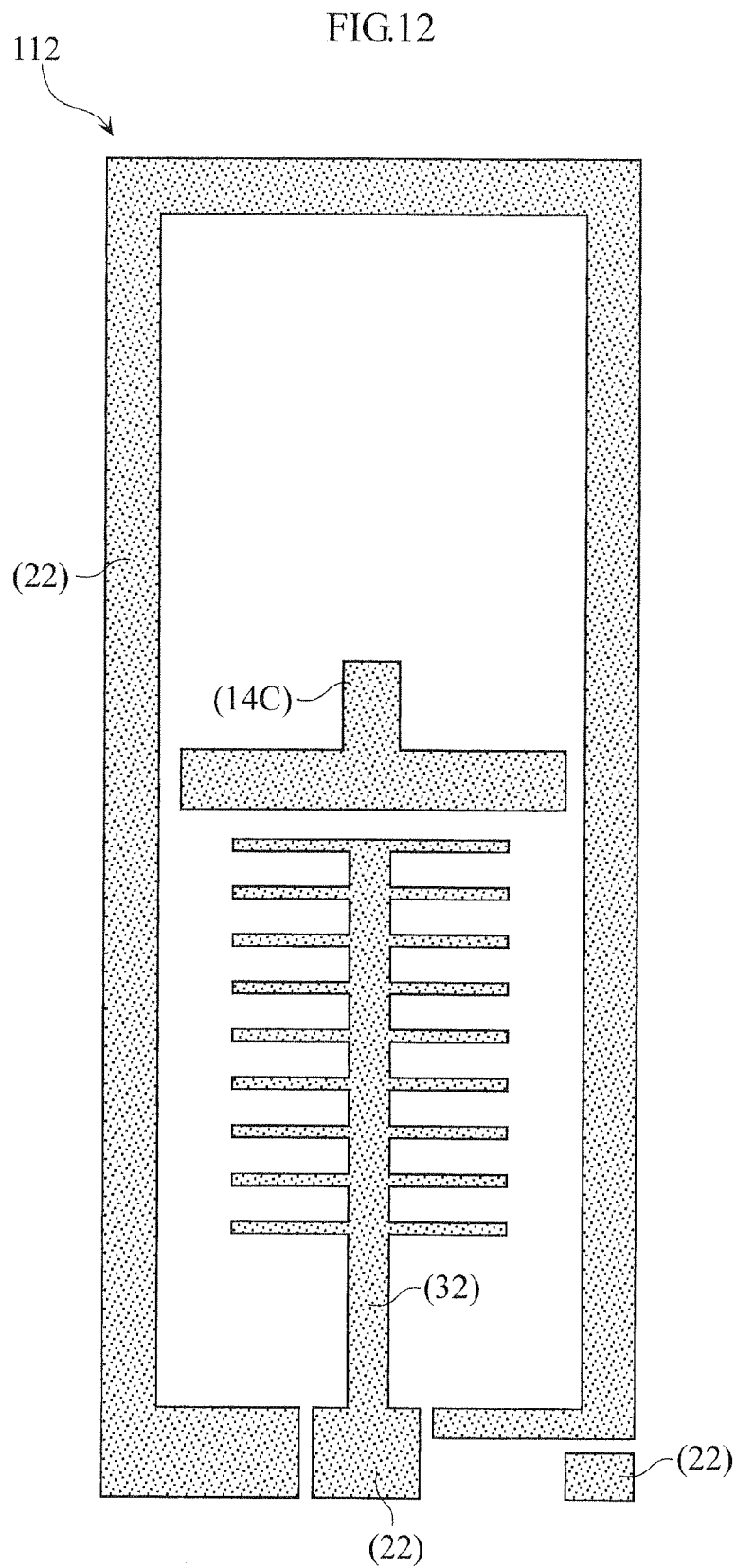
FIG. 12 is a plan view illustrating another mask pattern.

Then, as illustrated in FIG. 9(c), an oxide film pattern 110 and a resist pattern 111 are formed on the silicon layer 101, while an oxide film pattern 112 is formed on the silicon layer 102. The oxide film pattern 110 has a pattern shape which is illustrated in FIG. 11 and which corresponds to the pivotable portion 10 (including the land portion 11, the bar portion 13, the driving electrode 12 and the weight portions 14A and 14B) and part of the frame 20 and so on to be formed on the silicon layer 101. The resist pattern 111 has a pattern shape corresponding to the connecting portions 31. The oxide film pattern 112 has a shape which is illustrated in FIG. 12 and which corresponds to part of the frame 20, the driving electrode 32 and the weight portion 14C to be formed on the silicon layer 102.

Then, as illustrated in FIG. 9(d), the silicon layer 101 is etched to a predetermined depth by DRIE (deep reactive ion etching) by utilizing the oxide film pattern 110 and the resist pattern 111 as masks. The "predetermined depth" is the depth corresponding to the thickness of the connecting portions C1 and C2, which may be e.g. 5 μm. In the DRIE, proper anisotropic etching can be performed by the Bosch process in which etching using $SF_6$ gas and sidewall protection using $C_4F_8$ gas are alternately repeated. The Bosch process can be employed also in the DRIE described later.

Then, as illustrated in FIG. 10(a), the resist pattern 111 is removed. Specifically, the resist pattern 111 may be removed by using a remover.

Then, as illustrated in FIG. 10(b), by the DRIE utilizing the oxide film pattern 110 as a mask, the silicon layer 101 is etched to the insulating layer 103 while providing the connecting portions C1 and C2 by leaving the portions of the silicon layer corresponding to these portions. By this etching process, the pivotable portion 10 (including the land portion L, the bar portion B and the electrode E1), part (the first layer 21) of the frame 20 (including the frames F1, F2) and connecting portions 31 (including connecting portions C1 and C2) are formed.

Then, as illustrated in FIG. 10(c), by the DRIE utilizing the oxide film pattern 112 as a mask, the silicon layer 102 is etched to the insulating layer 103. By this etching process, part (the second layer 22) of the frame 20 (including the frames F1 and F2), the driving electrode 32 (including the electrode E2) and the weight portion 14C are formed.

Then, as illustrated in FIG. 10(d), the exposed portions of the insulating layer 103 and the oxide film patterns 110, 112 are etched away. As the etching method, dry etching or wet etching may be employed. In dry etching, $CF_4$ or $CHF_3$ may be used as the etching gas. In wet etching, buffered hydrofluoric acid (BHF) containing hydrofluoric acid and ammonium fluoride may be used as the etchant.

Through the above-described process, the land portion L, the bar portion B, the frames F1 and F2, the connecting portions C1 and C2, and the set of electrodes E1 and E2 and so on are formed, whereby the micro movable device X1 is obtained.

Figure 13:
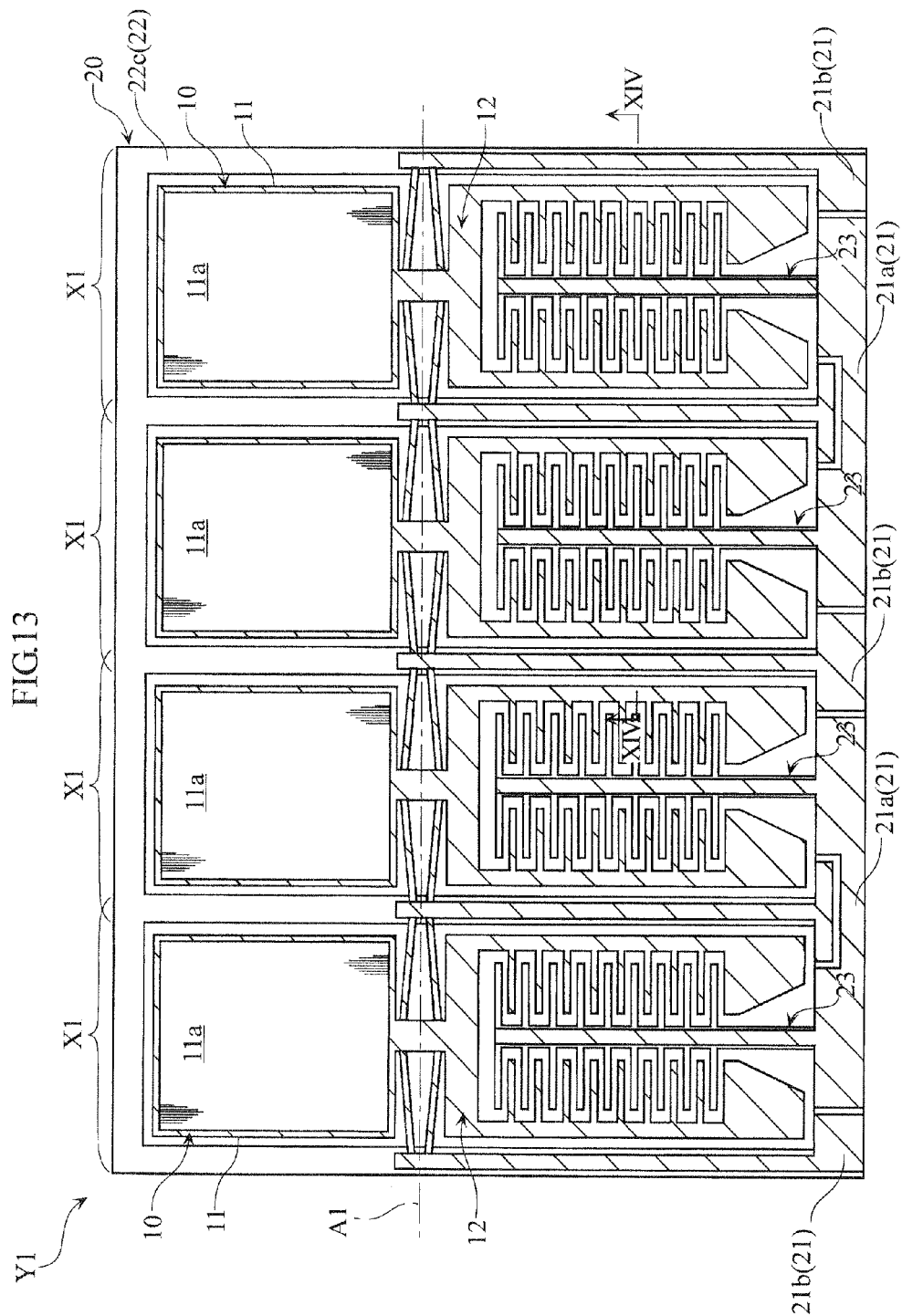
FIG. 13 is a plan view illustrating a micro movable device array according to a second embodiment of the present invention.
Figure 14:
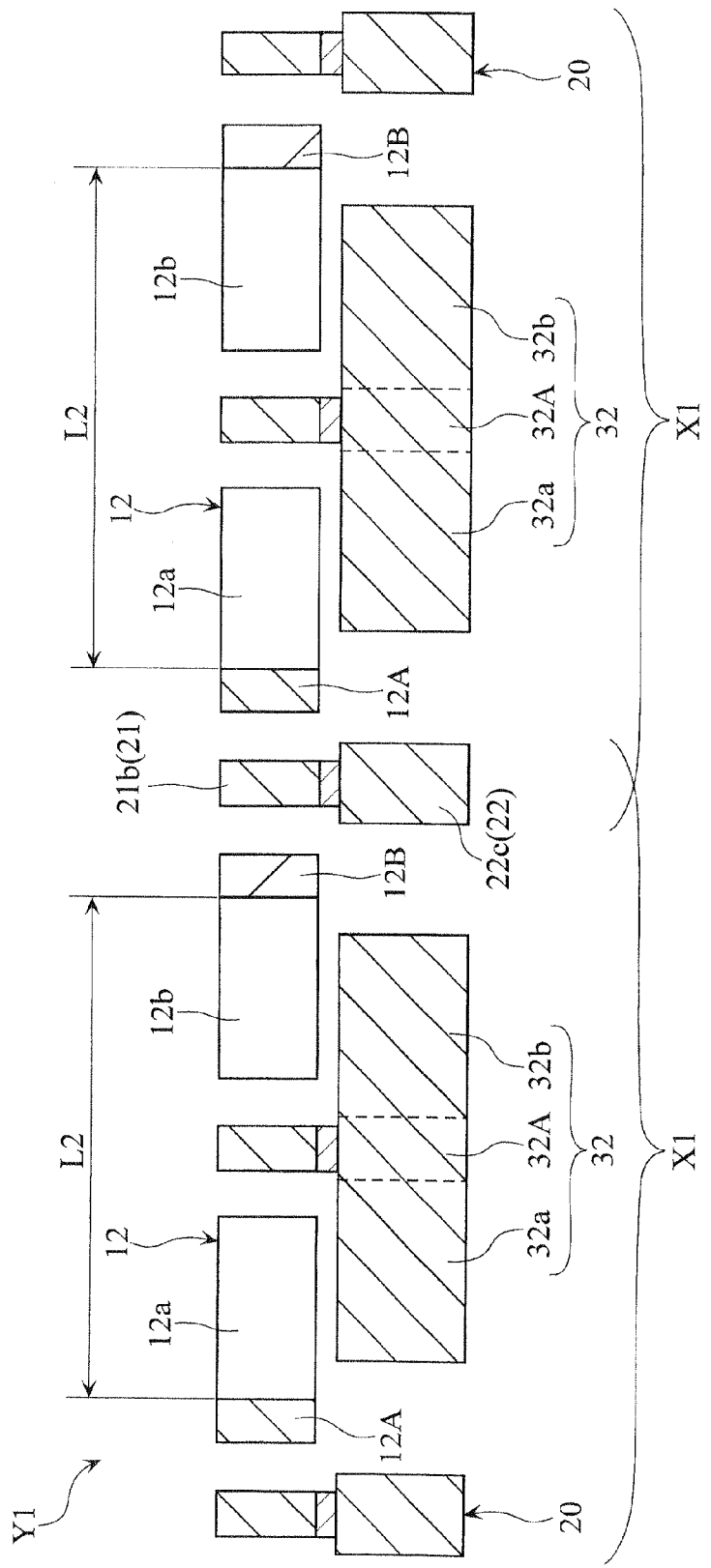
FIG. 14 is a partial enlarged sectional view taken along lines XIV-XIV in FIG. 13.

FIG. 13 illustrates a micro movable device array Y1 according to a second embodiment of the present invention. FIG. 14 is an enlarged sectional view taken along lines XIV-XIV in FIG. 13, illustrating part of the micro movable device array Y1.

The micro movable device array Y1 includes a plurality of micro movable devices X1 (four micro movable devices X1 in this embodiment). In the micro movable device array Y1, the micro movable devices X1 are arranged in a row in the direction of the axis A1 (i.e., arranged one-dimensionally). Thus, in the micro movable device array Y1, the plurality of mirror surfaces 11a are arranged in a row in the direction of the axis A1.

In the micro movable device array Y1, the portion 22c of the second layer 22 of the frame 20 is continuous over all of the micro movable devices X1. Thus, the driving electrodes 12, weight portions 14C of the pivotable portions 10 and portions 21b of the first layers 21 of the frames 20 of all the micro movable devices X1 are electrically connected to each other. In the micro movable device array Y1, the portion 21a of the first layer 21 of the frame 20 of each micro movable device X1 is continuous with the portion 21a of the first layer 21 of the frame 20 of the adjacent one of the micro movable devices X1.

To drive the micro movable device array Y1, with a predetermined reference potential applied in common to the driving electrodes 12 of the pivotable portions 10 of all the micro movable devices X1, a predetermined driving potential is applied to the driving electrode 32 of a selected micro movable device X1. By this operation, the pivotable portion 10 or the land portion 11 of each micro movable device X1 is individually driven into pivot movement, whereby the direction of the light reflection at the mirror surface 11a on the land portion 11 of each micro movable device X1 is changed appropriately. The specific technique for driving each micro movable device X1 is as described above with respect to the first embodiment.

As noted before with respect to the first embodiment, deterioration of the insulation properties of the insulating film 23 is suppressed in each of the micro movable devices X1, because the electric field to be generated is suppressed at the insulating film 23 (first insulating film) intervening between the portion 22c (first conductor portion) and another conductor portion (portion 21a) to electrically separate the two conductor portions and also suppressed at the insulating film 23 (second insulating film) intervening between the portion 22b (second conductor portion) and another conductor portion (portion 21a) to electrically separate the two conductor portions.

As noted before with respect to the first embodiment, in each of the micro movable devices X1, the pivotable portion 10 achieves a weight balance owing to the provision of the weight portions 14A, 14B and 14C. Thus, the amount of the rotational displacement of each pivotable portion 10 in the pivot movement is easily controlled with a high accuracy.

As noted before with respect to the first embodiment, in each of the micro movable devices X1, the driving electrode 32 is provided within the spacing distance L2 between the arms 12A and 12B which form the outermost portion of the structure of the driving mechanism (the driving electrodes 12 and 32) in the extending direction of the axis A1 and to which a reference potential (e.g. a ground potential) is applied during the driving of the device. With this arrangement, the electric field which is generated during the driving of the device from the driving electrode 32 due to a predetermined driving potential higher than the reference potential is easily absorbed by the arms 12A, 12B of the driving electrode 12. Thus, the leakage of the electric field to the outside of the device is suppressed. Thus, the micro movable device array Y1 can suppress the adverse effect of electric field leakage from the driving mechanism (driving electrodes 12 and 32) of one micro movable device X1 on the driving characteristics of the adjacent micro movable device X1. Therefore, the micro movable device array Y1 is suitable for the arrangement of a plurality of micro movable devices X1 and hence the mirror surfaces 11a with a small pitch. That is, the micro movable device array Y1 is suitable for increasing the density of the micro movable devices X1 or the mirror surfaces 11a.

As noted before with respect to the first embodiment, in each of the micro movable devices X1, the weight portion 14C, the portion 21b of the first layer 21 and the portion 22c of the second layer 22 also exhibit the effects of electric field absorption, in addition to the arms 12A, 12B of the driving electrode 12. The effects of electric field absorption by these portions also contribute to the suppression of the adverse effect of electric field leakage from the driving mechanism (driving electrodes 12 and 32) of one micro movable device X1 of the micro movable device array Y1 on the driving characteristics of the adjacent micro movable device X1.

Figure 15:
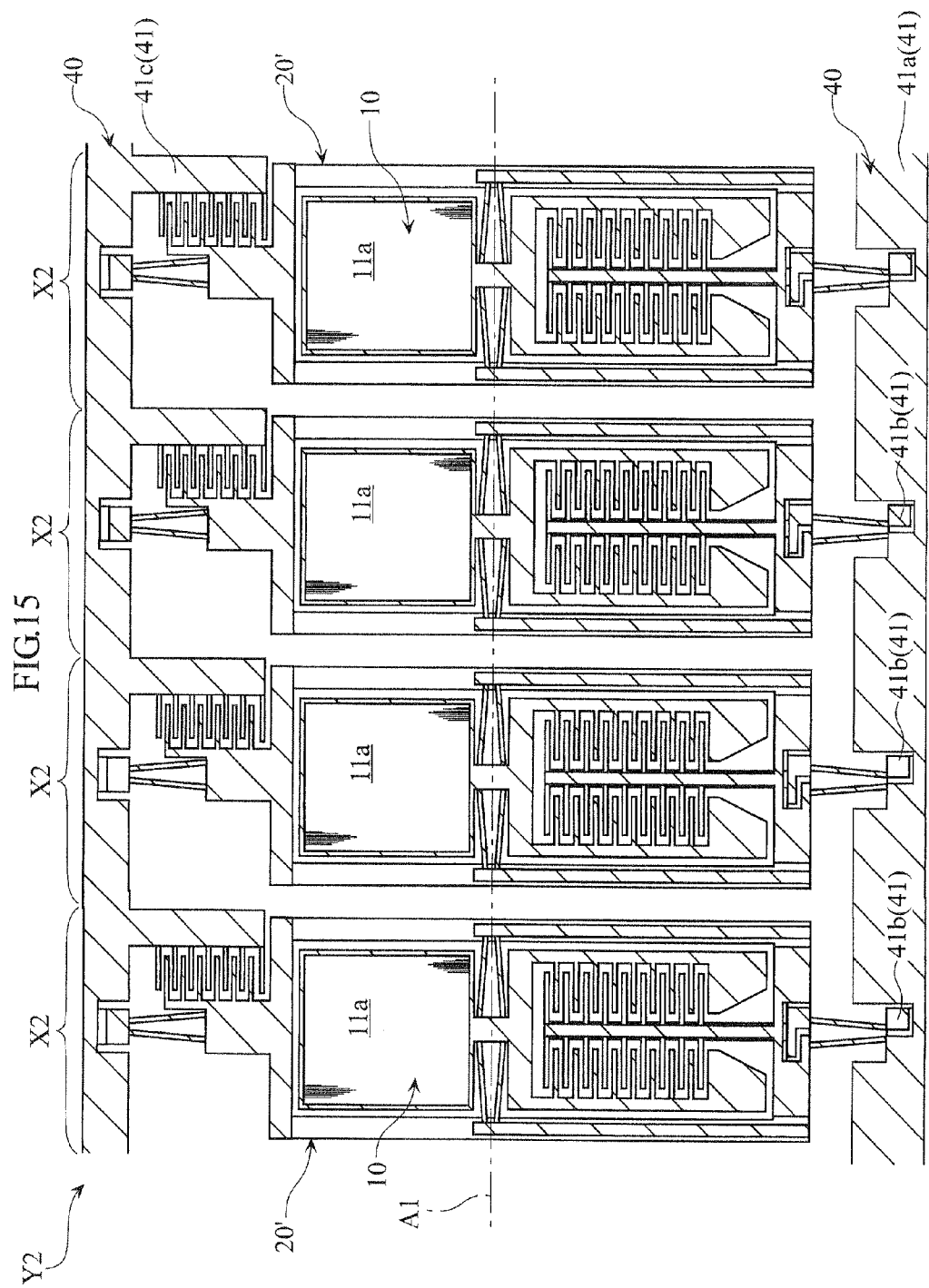
FIG. 15 is a plan view illustrating part of a micro movable device array according to a third embodiment of the present invention.

FIG. 15 is a partial plan view illustrating a micro movable device array Y2 according to a third embodiment of the present invention. The micro movable device array Y2 includes a plurality of micro movable devices X2. In the micro movable device array Y2, the micro movable devices X2 are arranged in a row (i.e., arranged one-dimensionally).

Figure 16:
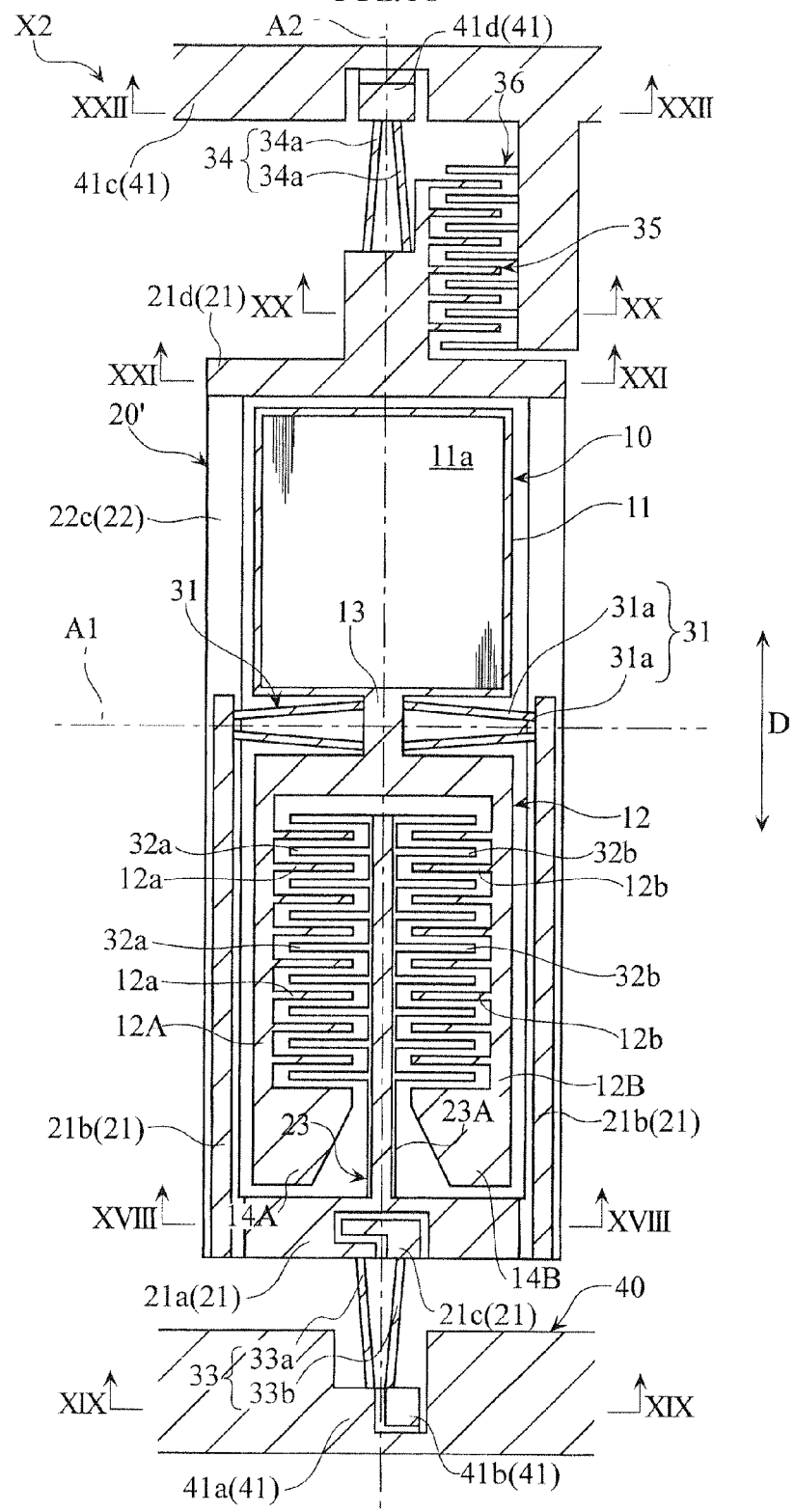
FIG. 16 is a plan view illustrating a micro movable device included in the micro movable device array illustrated in FIG. 15.
Figure 17:
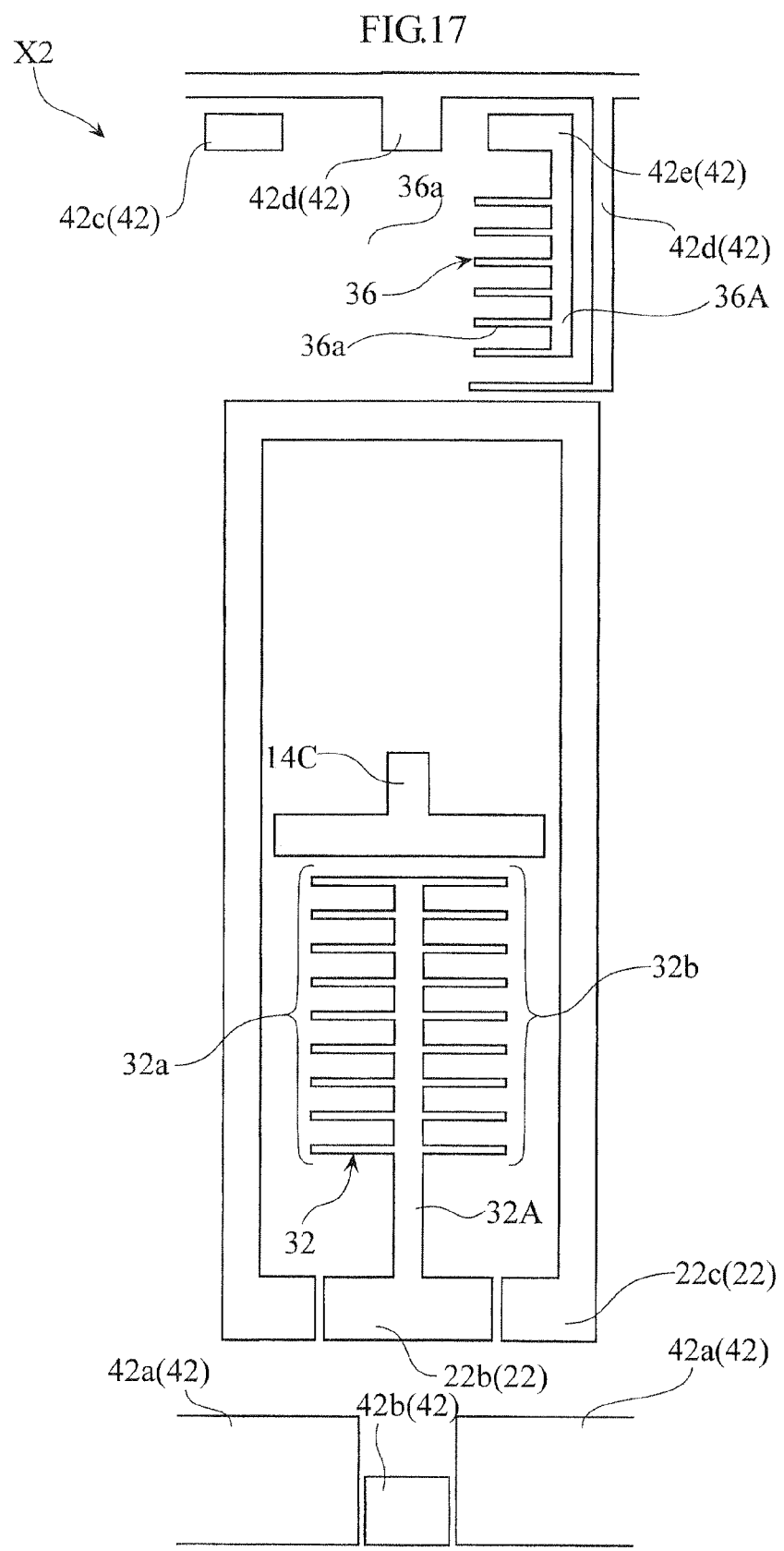
FIG. 17 is a partially omitted plan view of the micro movable device illustrated in FIG. 16.

FIGS. 16-22 illustrate a micro movable device X2 constituting the micro movable device array Y2. FIG. 16 is a plan view of the micro movable device X2. FIG. 17 is a partially omitted plan view of the micro movable device X2. FIGS. 18-22 are sectional views taken along lines XVIII-XVIII, lines XIX-XIX, lines XX-XX, lines XXI-XXI, and lines XXII-XXII in FIG. 16, respectively.

The micro movable device X2 includes a pivotable portion 10, a frame 20', a pair of connecting portions 31, a driving electrode 32, a frame 40, a pair of connecting portions 33, 34 and driving electrodes 35, 36 and is designed as a micro mirror device in this embodiment. The micro movable device X2 is made by working a material substrate, which is a so-called SOI wafer, by bulk micromachining such as MEMS. The material substrate has a laminated structure made up of a first silicon layer, a second silicon layer and an insulating layer intervening between the silicon layers. Each of the silicon layers has a predetermined electrical conductivity provided by doping impurity. The above-described portions of the micro movable device X1 are mainly made of the first silicon layer and/or the second silicon layer. To clarify the figure, the portions made of the first silicon layer and projecting toward the front side of the sheet surface of the figure relative to the insulating layer are hatched with oblique lines in FIG. 16. The structure illustrated in FIG. 17 is of the portions of the micro movable device X2 which are made of the second silicon layer.

The micro movable device X2 differs from the micro movable device X1 of the first embodiment in that the micro movable device X2 includes the frame 20' instead of the frame 20 and additionally includes the frame 40, the paired connecting portions 33 and 34, and the driving electrodes 35 and 36. The pivotable portion 10, the paired connecting portions 31 and the driving electrode 32 of the micro movable device X2 are the same as the pivotable portion 10, the paired connecting portions 31 and the driving electrode 32 of the micro movable device X1.

Figure 18:
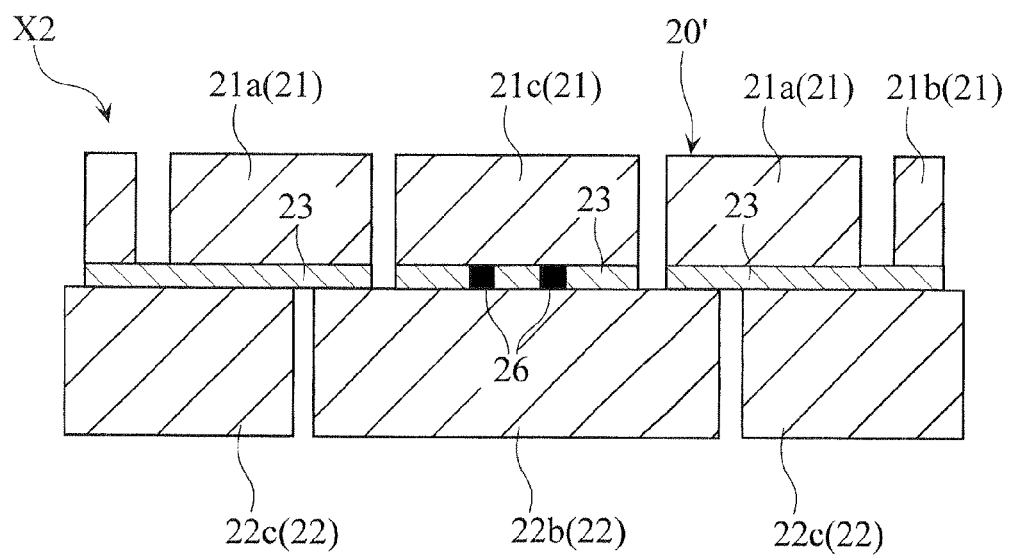
FIG. 18 is an enlarged sectional view taken along lines XVIII-XVIII in FIG. 16.
Figure 21:
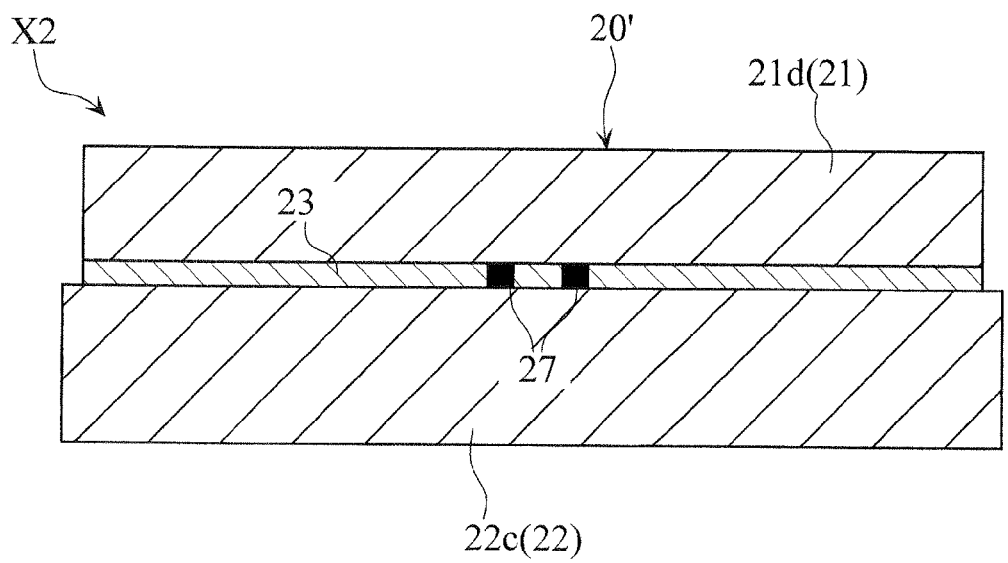
FIG. 21 is an enlarged sectional view taken along lines XXI-XXI in FIG. 16.

The frame 20' is substantially different from the frame of the first embodiment in that the first layer 21 includes portions 21c and 21d and the second layer 22 does not include the portion 22a. As illustrated in FIGS. 16 and 18, in the first layer 21, the portion 21c is separated from the portion 21a via a gap. As illustrated in FIG. 18, the portion 21c is electrically connected to the portion 22b of the second layer 22 of the frame 20' by conductive vias 26 penetrating the insulating film 23. As illustrated in FIG. 16, the portion 21d is positioned at an end of the frame 20' and includes a part extending in the direction indicated by the arrow D in FIG. 16. As illustrated in FIG. 21, the portion 21d is electrically connected to the portion 22c of the second layer 22 by conductive vias 27 penetrating the insulating film 23.

Figure 19:
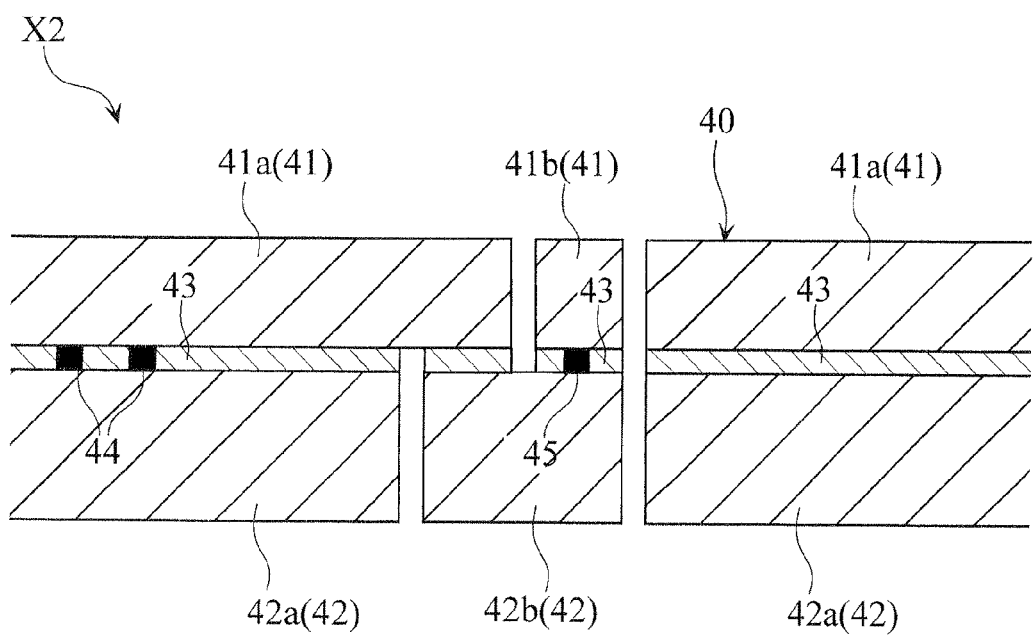
FIG. 19 is an enlarged sectional view taken along lines XIX-XIX in FIG. 16.
Figure 20:
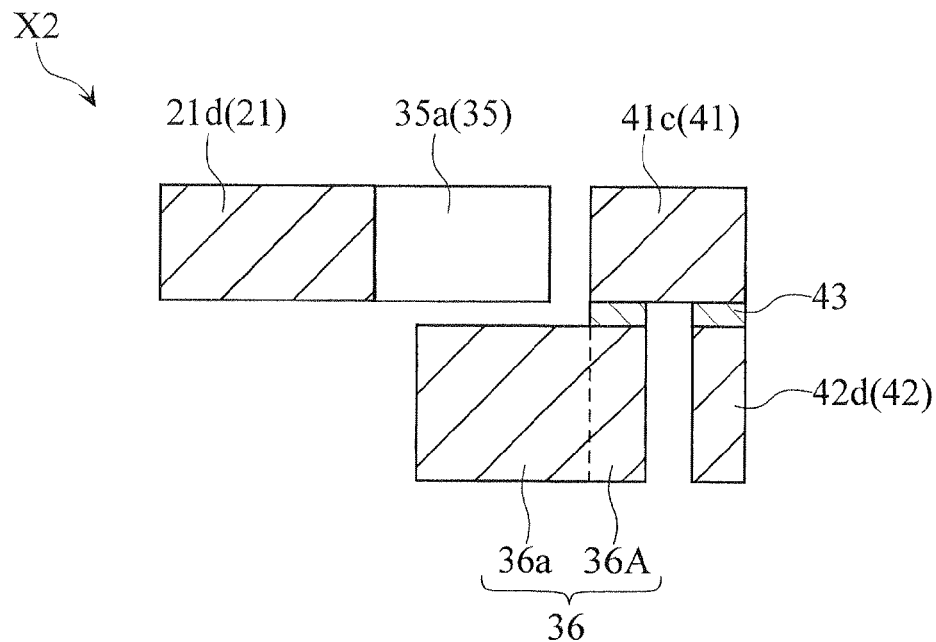
FIG. 20 is an enlarged sectional view taken along lines XX-XX in FIG. 16.

As illustrated in e.g. FIGS. 19 and 20, the frame 40 has a laminated structure made up of a first layer 41 made of the first silicon layer, a second layer 42 made of the second silicon layer, and an insulating film 43 between the first and the second layers 41 and 42.

Figure 22:
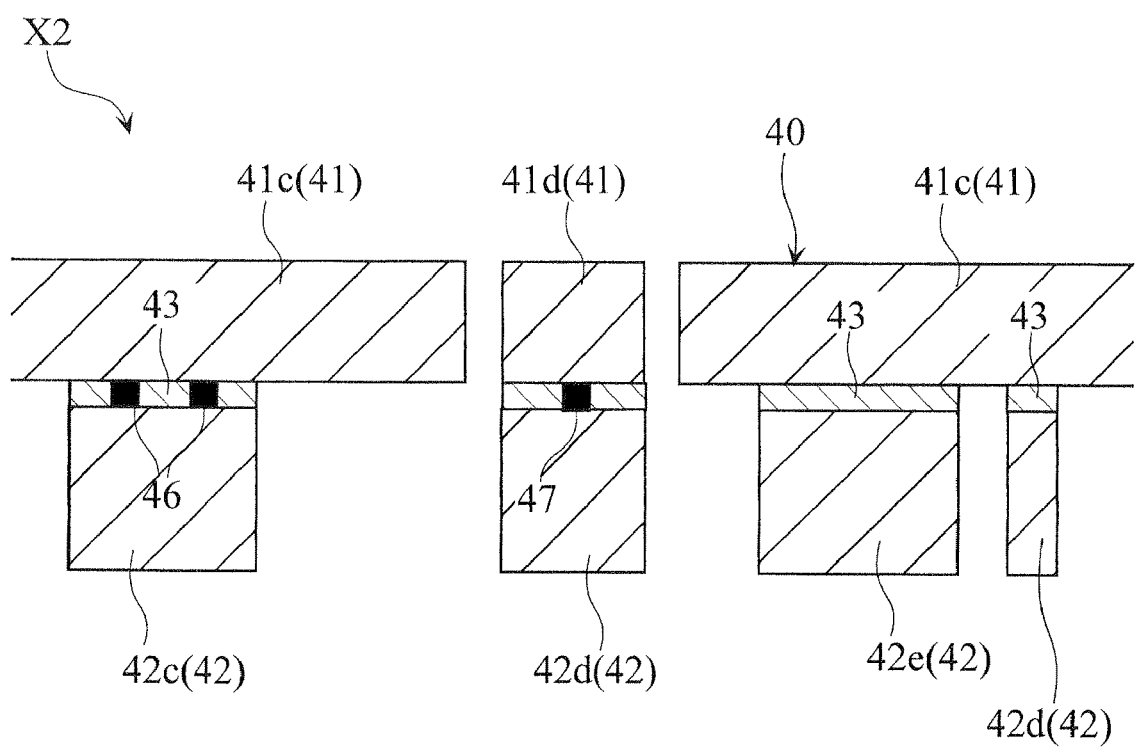
FIG. 22 is an enlarged sectional view taken along lines XXII-XXII in FIG. 16.
Figure 23:
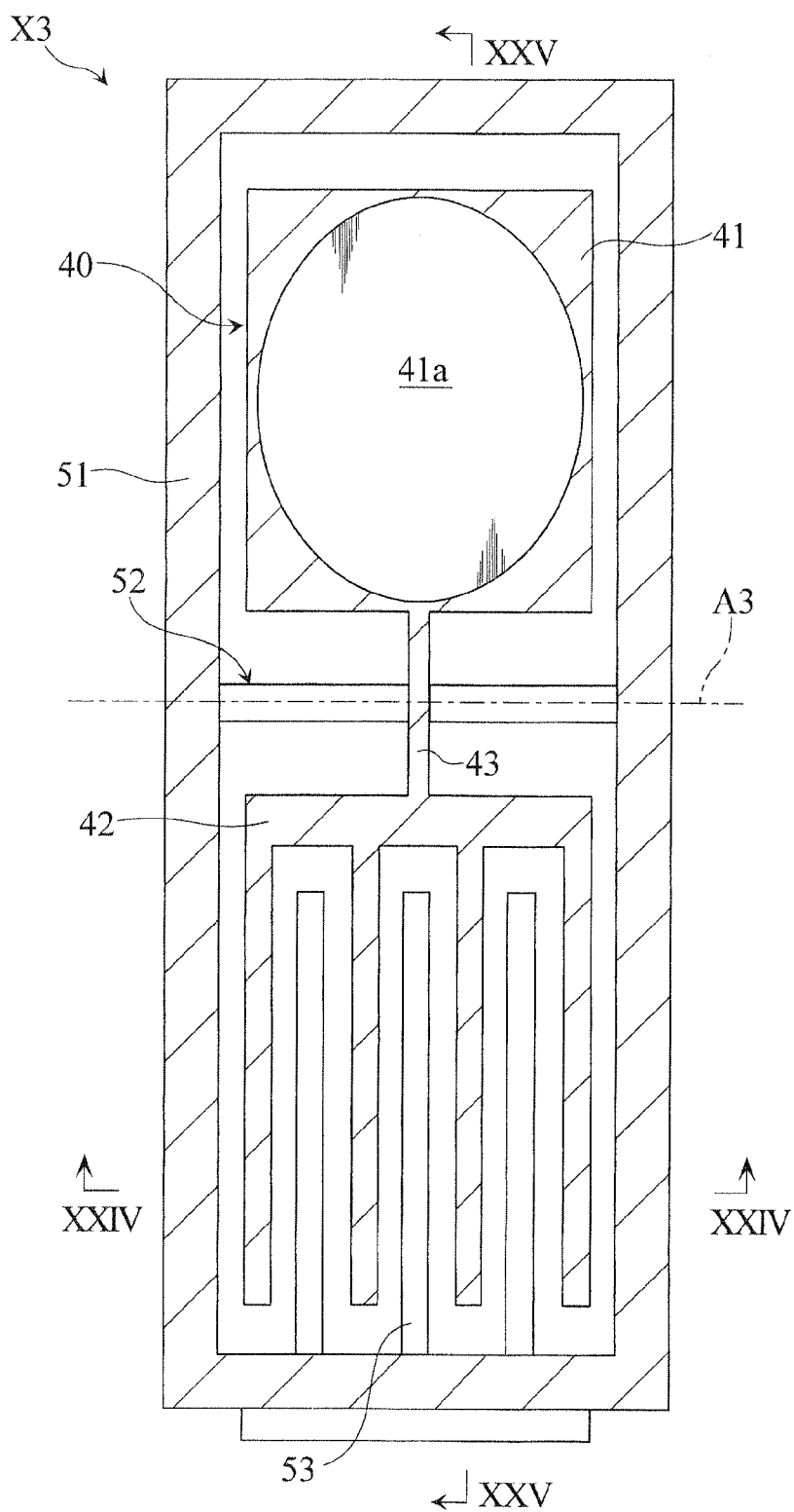
FIG. 23 is a plan view illustrating a conventional micro movable device.
Figure 24:
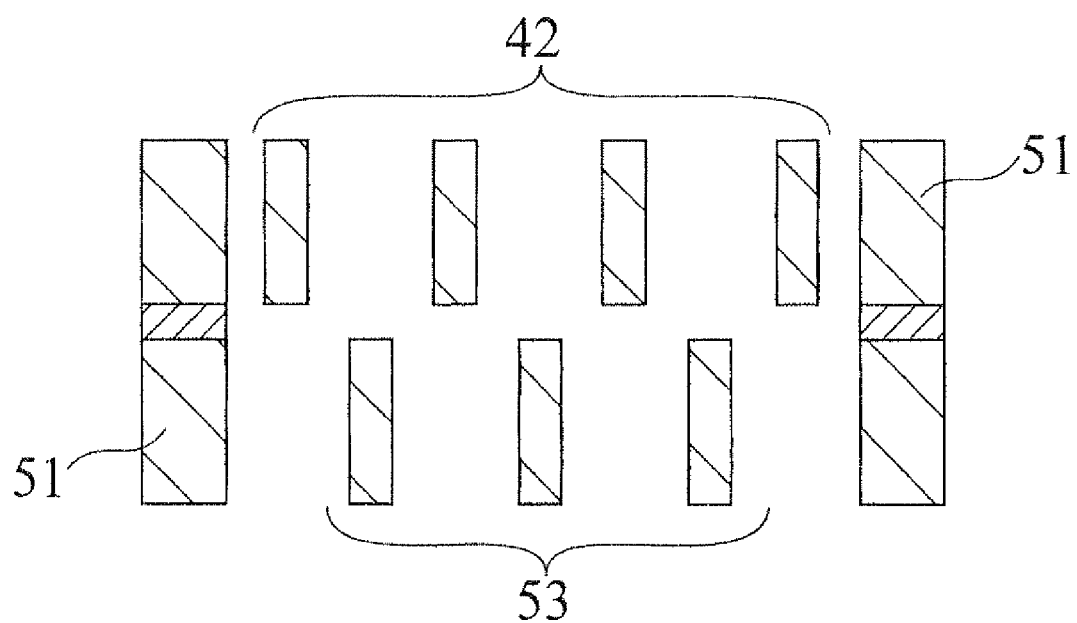
FIG. 24 is a sectional view taken along lines XXIV-XXIV in FIG. 23.
Figure 25:
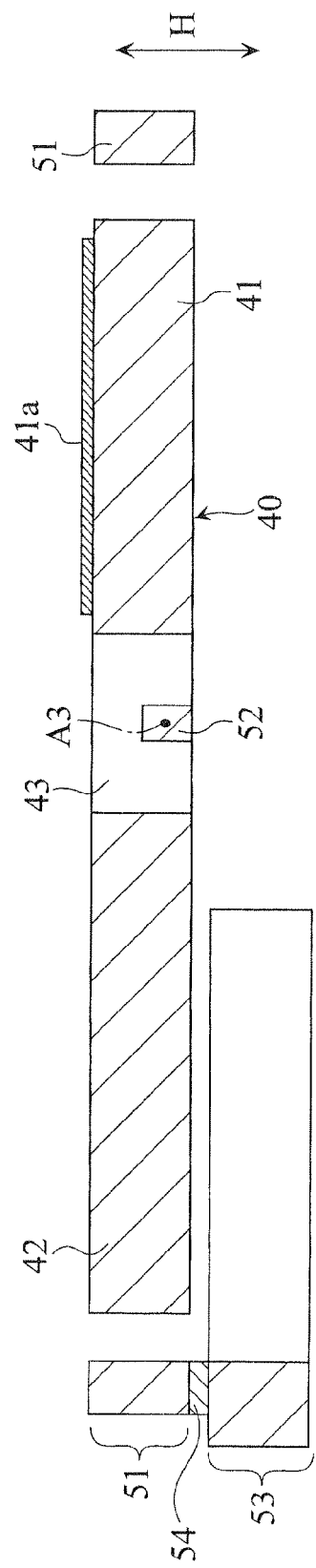
FIG. 25 is a sectional view taken along lines XXV-XXV in FIG. 23.

As illustrated in FIGS. 16, 19 and 22, the first layer 41 of the frame 40 is made up of portions 41a, 41b, 41c and 41d separated from each other via gaps. (The portions 41a and 41c may be connected to each other in a region which is not illustrated in the figures). The portion 41c is the third conductor portion of the present invention.

As illustrated in FIGS. 17, 19 and 22, the second layer 42 of the frame 40 is made up of portions 42a, 42b, 42c, 42d and 42e separated from each other via gaps. The portion 42d is the first conductor portion of the present invention. The portion 42e is the second conductor portion of the present invention.

As illustrated in FIG. 19, the portion 41a of the first layer 41 and the portion 42a of the second layer 42 are bonded together via the insulating film 43 and electrically connected to each other by conductive vias 44 penetrating the insulating film 43. As illustrated in FIG. 19, the portion 41b of the first layer 41 and the portion 42b of the second layer 42 are bonded together via the insulating film 43 and electrically connected to each other via a conductive via 45 penetrating the insulating film 43. As illustrated in FIG. 22, the portion 41c of the first layer 41 and the portion 42c of the second layer 42 are bonded together via the insulating film 43 and electrically connected to each other by conductive vias 46 penetrating the insulating film 43. As illustrated in FIG. 22, the portion 41d of the first layer 41 and the portion 42d of the second layer 42 are bonded together via the insulating film 43 and electrically connected to each other via a conductive via 47 penetrating the insulating film 43. As illustrated in FIGS. 20 and 22, the portion 41c of the first layer 41 and the portion 42d of the second layer 42 are bonded together via the insulating film 43. The portion 41c of the first layer 41 and the portion 42e of the second layer 42 are bonded together via the insulating film 43.

As illustrated in FIG. 16, the connecting portion 33 is made up of two torsion bars 33a and 33b. The torsion bar 33a is a portion made of the first silicon layer. The torsion bar 33a is connected to the portion 21a of the first layer 21 of the frame 20' and the portion 41a of the first layer 41 of the frame 40 to connect the frames 20' and 40 to each other. The portions 21a and 41a are electrically connected to each other by the torsion bar 33a. The torsion bar 33b is a portion made of the first silicon layer. The torsion bar 33b is connected to the portion 21c of the first layer 21 of the frame 20' and the portion 41b of the first layer 41 of the frame 40 to connect the frames 20' and 40 to each other. The portions 21c and 41b are electrically connected to each other by the torsion bar 33b. The distance between the two torsion bars 33a 33b gradually increases from the frame 40 side toward the frame 20' side. The torsion bars 33a and 33b are thin, similarly to the torsion bars 31a of the connecting portions 31 of the first embodiment.

As illustrated in FIG. 16, the connecting portion 34 is made up of two torsion bars 34a. Each of the torsion bars 34a is a portion made of the first silicon layer. The torsion bar 34a is connected to the portion 21d of the first layer 21 of the frame 20' and the portion 41d of the first layer 41 of the frame 40 to connect the frames 20' and 40 to each other. The portions 21d and 41d are electrically connected to each other by the torsion bar 34a. The distance between the two torsion bars 34a gradually increases from the frame 40 side toward the frame 20' side. The torsion bars 34a are thin, similarly to the torsion bars 31a of the connecting portions 31 of the first embodiment.

The paired connecting portions 33 and 34 define the axis A2 of the pivot movement of the frame 20'. The axis A2 extends in the direction indicated by the arrow D in FIG. 16. The connecting portion 33 including two torsion bars 33a and 33b the distance between which gradually increases from the frame 40 side toward the frame 20' side and the connecting portion 34 including two torsion bars 34a the distance between which gradually increases from the frame 40 side toward the frame 20' side are suitable for preventing the generation of an unnecessary displacement component in the pivot movement of the frame 20'.

The driving electrode 35 is a portion made of the first silicon layer and made up of a plurality of electrode teeth 35a. The electrode teeth 35a extend from the portion 21d of the frame 20' toward the driving electrode 36 side and are in parallel with each other while being spaced in the extending direction of the axis A2.

The driving electrode 36 is a portion made of the second silicon layer and made up of an arm 36A and a plurality of electrode teeth 36a. As illustrated in e.g. FIG. 17, the arm 36A extends from the portion 42e of the second layer 41 of the frame 40 in the extending direction of the axis A2. The electrode teeth 36a extend from the arm 36A toward the driving electrode 35 side and are in parallel with each other while being spaced in the extending direction of the arm 36A.

In the micro movable device X2, the paired driving electrodes 12 and 32 form a driving mechanism or an actuator for generating a driving force for the pivotable portion 10, whereas the paired driving electrodes 35 and 36 form a driving mechanism or an actuator for generating a driving force for the frame 20'.

To drive the micro movable device X2, a reference potential is applied to the driving electrodes 12 and 35, a first driving potential is applied to the driving electrode 32, a second driving potential is applied to the driving electrode 36, and an intermediate potential is applied to the portion 21a of the first layer 21 of the frame 20' and the portion 41c of the first layer 41 of the frame 40.

The application of a reference potential to the driving electrode 12 can be achieved via the portion 42d of the second layer 42 of the frame 40 (illustrated in e.g. FIG. 22), the conductive via 47, the portion 41d of the first layer, the torsion bars 34a of the connecting portion 34 (illustrated in FIG. 16), the portion 21d of the first layer 21 of the frame 20', the conductive vias 27 (illustrated in FIG. 21), the portion 22c of the second layer 22, the conductive via 25 (illustrated in FIG. 6 with respect to the first embodiment), the portion 21b of the first layer 21, the torsion bars 31a of the connecting portions 31 (illustrated in FIG. 16) and the bar portion 13 of the pivotable portion 10. The reference potential is e.g. a ground potential or $-V_1$ and maintained constant.

The application of a reference potential to the driving electrode 35 can be achieved via the portion 42d of the second layer 42 of the frame 40, the conductive via 47, the portion 41d of the first layer, the torsion bars 34a of the connecting portion 34, the portion 21d of the first layer 21 of the frame 20'. The driving electrodes 12 and 35 are electrically connected to each other.

The application of the first driving potential to the driving electrode 32 can be achieved via the portion 42b of the second layer 42 of the frame 40 (illustrated in e.g. FIG. 19), the conductive via 45, the portion 41b of the first layer 41, the torsion bar 33b of the connecting portion 33 (illustrated in FIG. 16), the portion 21c of the first layer 21 of the frame 20', the conductive vias 26 (illustrated in FIG. 18) and the portion 22b of the second layer 22. When the reference potential is a ground potential, the first driving potential is e.g. 0 to $V_2$. When the reference potential is $-V_1$, the first driving potential is e.g. $-V_1$ to $V_3$ ($|-V_1|=|V_3|$).

The application of the second driving potential to the driving electrode 36 can be achieved via the portion 42e of the second layer 42 of the frame 40 independently from the potential application to the driving electrode 32. When the reference potential is a ground potential, the second driving potential is 0 to $V_2$. When the reference potential is $-V_1$, the second driving potential is e.g. $-V_1$ to $V_3$ ($|-V_1|=|V_3|$).

The application of the intermediate potential to the portion 21a of the first layer 21 of the frame 20' (illustrated in e.g. FIG. 18) can be achieved via the portion 42a of the second layer 42 of the frame 40 (illustrated in e.g. FIG. 19), the conductive vias 44, the portion 41a of the first layer 41, the torsion bar 33a of the connecting portion 33 (illustrated in FIG. 16), and the portion 21a of the first layer 21 of the frame 20'. When the reference potential to be applied to the portion 22c of the second layer 22 of the frame 20' is a ground potential and the first driving potential to be applied to the portion 22b of the second layer 22 of the frame 20' is 0 to $V_2$, the intermediate potential to be applied to the portion 21a is e.g. $V_2/2$. When the reference potential to be applied to the portion 22c of the second layer 22 of the frame 20' is $-V_1$ and the first driving potential to be applied to the portion 22b of the second layer 22 of the frame 20' is e.g. $-V_1$ to $V_3$ ($|-V_1|=|V_3|$), the intermediate potential to be applied to the portion 21a is e.g. a ground potential.

The application of the intermediate potential to the portion 41c of the first layer 41 of the frame 40 (illustrated in e.g. FIG. 22) can be achieved via the portion 42c of the second layer 42 of the frame 40 and the conductive vias 46 When the reference potential to be applied to the portion 42d of the second layer 42 of the frame 40 is a ground potential and the second driving potential to be applied to the portion 42e of the second layer 42 of the frame 40 is 0 to $V_2$, the intermediate potential to be applied to the portion 41c is e.g. $V_2/2$. When the reference potential to be applied to the portion 42d of the second layer 42 of the frame 40 is $-V_1$ and the second driving potential to be applied to the portion 42e of the second layer 42 of the frame 40 is e.g. $-V_1$ to $V_3$ ($|-V_1|=|V_3|$), the intermediate potential to be applied to the portion 41c is e.g. a ground potential.

In the micro movable device X2, by applying a first driving potential to the driving electrode 32 as required, an electrostatic attraction is generated between the driving electrodes 12 and 32 to drive the pivotable portion 10 into pivot movement about the axis A1. Further, by applying a second driving potential to the driving electrode 36 as required, an electrostatic attraction is generated between the driving electrodes 35 and 36 to drive the frame 20' along with the pivotable portion 10 into pivot movement about the axis A2. The micro movable device X2 is a so-called dual-axis oscillation device. By the driving of the dual-axis pivot movement, the direction of the light reflection at the mirror surface 11a on the land portion 11 of the micro movable device X2 is changed appropriately.

In the micro movable device X2, when a potential difference is generated and hence an electric field is generated between the driving electrodes 12 and 32, a potential difference is generated also between the portion 22c (first conductor portion) of the second layer 22 of the frame 20', which is electrically connected to the driving electrode 12, and the portion 22b (second conductor portion) of the second layer 22 of the frame 20', which is electrically connected to the driving electrode 32. In the micro movable device X2, however, the portions 22b and 22c, between which a relatively great potential difference is generated, are not bonded together via a single insulating film. That is, in the micro movable device X2, there exists the portion 21a (third conductor portion) of the first layer 21 of the frame 20', which is bonded to the portion 22c via the insulating film 23 (first insulating film) and bonded to the portion 22b via the insulating film 23 (second insulating film), and this portion 21a mechanically connects the portions 22b and 22c to each other. Thus, in the micro movable device X2, the potential difference between the portions 21a and 22c and that between the portions 21a and 22b are suppressed. As a result, the micro movable device X1 can suppress the electric field generated at the insulating film 23 between the portions 21a and 22c and the electric field generated at the insulating film 23 between the portions 21a and 22b. Specifically, when a reference potential is to be applied to the portion 22b and a variable driving potential is to be applied to the portion 22c, an intermediate potential between the reference potential and the maximum driving potential is applied to the portion 21a. By doing so, the potential difference between the portions 21a and 22c is suppressed to result in the suppression of the electric field generated at the insulating film 23 (first insulating film), while the potential difference between the portions 21a and 22b is suppressed to result in the suppression of the electric field generated at the insulating film 23 (second insulating film).

Thus, deterioration of the insulation properties of the insulating film 23 is suppressed in the micro movable device X2 in which the electric field to be generated is suppressed at the insulating film 23 (first insulating film) intervening between the portion 22c (first conductor portion) and another conductor portion (portion 21a) to electrically separate the two conductor portions and also suppressed at the insulating film 23 (second insulating film) intervening between the portion 22b (second conductor portion) and another conductor portion (portion 21a) to electrically separate the two conductor portions. Thus, the micro movable device X2 is suitable for suppressing deterioration of the driving characteristics caused by the deterioration of the insulation properties.

In the micro movable device X2, when a potential difference is generated and hence an electric field is generated between the driving electrodes 35 and 36, a potential difference is generated also between the portion 42d (first conductor portion) of the second layer 42 of the frame 40, which is electrically connected to the driving electrode 35, and the portion 42e (second conductor portion) of the second layer 42 of the frame 40, which is electrically connected to the driving electrode 36. In the micro movable device X2, however, the portions 42d and 42e, between which a relatively great potential difference is generated, are not bonded together via a single insulating film. That is, in the micro movable device X2, there exists the portion 41c (third conductor portion) of the first layer 41 of the frame 40, which is bonded to the portion 42d via the insulating film 43 (first insulating film) and bonded to the portion 42e via the insulating film 43 (second insulating film), and this portion 41c mechanically connects the portions 42d and 42e to each other. Thus, in the micro movable device X2, the potential difference between the portions 41c and 42d and that between the portions 41c and 42e are suppressed. As a result, the micro movable device X2 can suppress the electric field generated at the insulating film 43 between the portions 41c and 42d and the electric field generated at the insulating film 43 between the portions 41c and 42e. Specifically, when a reference potential is to be applied to the portion 42d and a variable driving potential is to be applied to the portion 42e, an intermediate potential between the reference potential and the maximum driving potential is applied to the portion 41c. By doing so, the potential difference between the portions 41c and 42d is suppressed to result in the suppression of the electric field generated at the insulating film 43 (first insulating film), while the potential difference between the portions 41c and 42e is suppressed to result in the suppression of the electric field generated at the insulating film 43 (second insulating film).

Thus, deterioration of the insulation properties of the insulating film 43 is suppressed in the micro movable device X2 in which the electric field is suppressed at the insulating film 43 (first insulating film) intervening between the portion 42d (first conductor portion) and another conductor portion (portion 41c) to electrically separate the two conductor portions and also suppressed at the insulating film 43 (second insulating film) intervening between the portion 42e (second conductor portion) and another conductor portion (portion 41c) to electrically separate the two conductor portions. Thus, the micro movable device X2 is suitable for suppressing deterioration of the driving characteristics caused by the deterioration of the insulation properties.

In the micro movable device X2, which includes substantially all of the structural elements of the micro movable device X1 of the first embodiment, the amount of the rotational displacement of the pivotable portion 10 in the pivot movement is easily controlled with a high accuracy, similarly to the above-described first embodiment.

In the micro movable device X2, which includes substantially all of the structural elements of the micro movable device X1 of the first embodiment, the leakage of the electric field generated from the driving electrode 32 during the driving of the device to the outside of the device is suppressed, similarly to the above-described first embodiment.

The micro movable device array Y2 illustrated in FIG. 15 includes such micro movable devices X2. In the micro movable device array Y2, the plurality of micro movable devices X2 are arranged in a row so that all the axes A2 (not illustrated in FIG. 15) extend in parallel with each other.

In the micro movable device array Y2, the portion 42d of the second layer 42 of the frame 40 is continuous over all of the micro movable devices X2. With this arrangement, the driving electrodes 12 of all the micro movable devices X2, which are electrically connected to the portions 42d, are electrically connected to each other. Further, the driving electrodes 35 of all the micro movable devices X2, which are electrically connected to the portions 42d, are electrically connected to each other. Thus, in driving the micro movable device array Y2, a predetermined reference potential can be applied in common to the driving electrodes 12 and 35 of the pivotable portions 10 of all the micro movable devices X2. With the predetermined reference potential applied in common to the driving electrodes 12 and 35 of the pivotable portions of all the micro movable devices X2, a predetermined driving potential is applied to each of the driving electrodes 32 and 36 of a selected micro movable devices X2. By this operation, the pivotable portion 10 and the frame 20' of each micro movable device X2 are individually driven into pivot movement, whereby the direction of the light reflection at the mirror surface 11a on the land portion 11 of each micro movable device X2 is changed appropriately.

As noted before, in each of the micro movable devices X2 of the micro movable device array Y2, the leakage of the electric field generated from the driving electrode 32 during the driving of the device to the outside of the device is suppressed. Thus, the micro movable device array Y2 can suppress the adverse effect of electric field leakage from the driving mechanism (driving electrodes 12 and 32) of one micro movable device X2 on the driving characteristics of the adjacent micro movable device X2. Therefore, the micro movable device array Y2 is suitable for the arrangement of a plurality of dual-axis micro movable devices X2 and hence the mirror surfaces 11a with a small pitch. That is, the micro movable device array Y2 is suitable for increasing the density of the micro movable devices X2 or the mirror surfaces 11a.

The invention claimed is:

1. A micro movable device comprising:
a movable portion including a first driving electrode;

a second driving electrode for generating electrostatic attraction between the first driving electrode and the second driving electrode;

a first conductor portion electrically connected to the first driving electrode;

a second conductor portion electrically connected to the second driving electrode; and a third conductor portion that is not electrically connected to the first and the second driving electrodes, the third conductor portion being bonded to the first conductor portion via an insulating film and bonded to the second conductor portion via an insulating film.

2. The micro movable device according to claim 1, wherein a reference potential is applied to the first conductor portion, a variable driving potential is applied to the second conductor portion, and an intermediate potential between the reference potential and a maximum driving potential is applied to the third conductor portion.

3. The micro movable device according to claim 1, wherein a reference potential is applied to the second conductor portion, a variable driving potential is applied to the first conductor portion, and an intermediate potential between the reference potential and a maximum driving potential is applied to the third conductor portion.

4. The micro movable device according to claim 1, further comprising:

a frame; and a connecting portion connecting the frame and the movable portion to each other and defining an axis of pivot movement of the movable portion.

5. The micro movable device according to claim 4, further comprising:

an additional frame;

an additional connecting portion connecting the frame and the additional frame to each other and defining an additional axis of pivot movement of the frame, the additional axis extending in a direction crossing said axis; and a driving mechanism for generating a driving force of the pivot movement of the frame.

6. The micro movable device according to claim 5, wherein the additional connecting portion includes a portion electrically connected to the first conductor portion, a portion electrically connected to the second conductor portion and a portion electrically connected to the third conductor portion.

7. The micro movable device according to claim 1, wherein the third conductor portion includes a plurality of electrically separated portions including a first portion bonded to the first conductor portion via an insulating film and a second portion bonded to the second conductor portion via an insulating film.

8. The micro movable device according to claim 1, wherein each of the first and the second driving electrodes is a comb-tooth electrode.

9. The micro movable device according to claim 1, wherein a spacing distance between the first and the second driving electrodes is greater than a thickness of the insulating film.

10. A micro movable device array including a plurality of micro movable devices as set forth in any one of claims 1 through 9.

11. The micro movable device array according to claim 10, wherein a potential is capable of being applied in common to the first driving electrodes of the movable portions of the plurality of micro movable devices, whereas a potential is capable of being applied individually to the second driving electrode of each of the micro movable devices.

* * * * *